(12) United States Patent
Fukushima et al.

(10) Patent No.: US 7,563,693 B2
(45) Date of Patent: Jul. 21, 2009

(54) METHOD FOR MANUFACTURING SEMICONDUCTOR SUBSTRATE AND SEMICONDUCTOR SUBSTRATE

(75) Inventors: Yasumori Fukushima, Nara (JP); Yutaka Takafuji, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 369 days.

(21) Appl. No.: 11/147,359

(22) Filed: Jun. 8, 2005

(65) Prior Publication Data

US 2005/0282019 A1 Dec. 22, 2005

(30) Foreign Application Priority Data

Jun. 18, 2004 (JP) ............................. 2004-181527

(51) Int. Cl.
*H01L 21/30* (2006.01)
*H01L 21/322* (2006.01)

(52) U.S. Cl. ................. 438/458; 438/455; 438/471; 438/473; 438/475; 257/E21.212; 257/E21.319

(58) Field of Classification Search ................. 438/455, 438/458, 471, 472, 473, 474, 475, 476, 477; 257/E21.318, E21.319, E21.32, E21.321, 257/E21.212, E21.213
See application file for complete search history.

(56) References Cited

U.S. PATENT DOCUMENTS

| 6,770,507 | B2 | 8/2004 | Abe et al. | |
|---|---|---|---|---|
| 6,774,435 | B1 | 8/2004 | Matsumoto et al. | |
| 6,790,771 | B2 * | 9/2004 | Wu | 438/637 |
| 6,946,361 | B2 * | 9/2005 | Takayama et al. | 438/455 |
| 7,183,172 | B2 * | 2/2007 | Lee et al. | 438/407 |
| 7,508,034 | B2 | 3/2009 | Takafuji et al. | |
| 2003/0159644 | A1 * | 8/2003 | Yonehara et al. | 117/8 |
| 2003/0189205 | A1 * | 10/2003 | Horikoshi et al. | 257/48 |
| 2003/0218212 | A1 * | 11/2003 | Lee et al. | 257/347 |

FOREIGN PATENT DOCUMENTS

| JP | 2000-196047 | 7/2000 |
|---|---|---|
| JP | 2004-79645 | 3/2004 |
| WO | WO 00/19499 | 4/2000 |

OTHER PUBLICATIONS

M. Bruel et al., "Smart-Cut: A New Silicon On Insulator Material Technology Based on Hydrogen Implantation and Wafer Bonding", Jpn. J. Appl. Phys., vol. 36, 1997, pp. 1636-1641, Part 1, No. 3B.
G.K. Celler et al., "Frontiers of silicon-on-insulator", Journal of Applied Physics, vol. 93, No. 9, May 1, 2003.

* cited by examiner

*Primary Examiner*—Alexander G Ghyka
*Assistant Examiner*—Seahvosh J Nikmanesh
(74) *Attorney, Agent, or Firm*—Nixon & Vanderhye P.C.

(57) ABSTRACT

A method for manufacturing a semiconductor substrate comprises the steps of: forming a gate oxide film as an insulating layer on the surface of a semiconductor substrate; implanting boron ions for inhibiting the migration of a peeling substance in the semiconductor substrate to form an anti-diffusion layer in the semiconductor substrate; activating boron in the anti-diffusion layer by heat treatment; implanting hydrogen ions into the semiconductor substrate to form a peel layer in part of the semiconductor substrate at a side of the anti-diffusion layer opposite to the gate oxide film; bonding a glass substrate to the surface of the semiconductor substrate where the gate oxide film has been formed; and heat-treating the semiconductor substrate to separate part of the semiconductor substrate along the peel layer.

13 Claims, 15 Drawing Sheets

Conventional Art

METHOD FOR MANUFACTURING SEMICONDUCTOR SUBSTRATE AND SEMICONDUCTOR SUBSTRATE

CROSS-REFERENCE TO RELATED APPLICATION

This non-provisional application claims priority under 35 U.S.C. § 119(a) on Patent Application No. 2004-181527 filed in Japan on Jun. 18, 2004, the entire contents of which are hereby incorporated by reference.

BACKGROUND (a) Field of the Technology

The present technology relates to a method for manufacturing a semiconductor substrate and a semiconductor substrate.

(b) Description of Related Art

So far, there have been known SOI (silicon-on-insulator) substrates including an insulating layer and a monocrystalline silicon layer formed on the insulating layer. If elements such as transistors are formed on the SOI substrate, parasitic capacitance decreases and insulation resistance increases. That is, the SOI substrate allows an increase in packing density and an improvement in performance of the elements. The insulating layer is, for example, a silicon oxide ($SiO_2$) film.

Aiming at an increase in operation speed of the elements and a further decrease in parasitic capacitance, the monocrystalline silicon layer in the SOI substrate is desired to be thin. For example, there is a known method for manufacturing the SOI substrate by bonding a pair of substrates (e.g., see Michel Bruel, "Smart-Cut: A New Silicon On Insulator Material Technology Based on Hydrogen Implantation and Wafer Bonding", Jpn. J. Appl. Phys., vol. 36 (1997) pp. 1636-1641).

Referring to FIGS. 35 to 38, an explanation is given of the method for forming the SOI substrate by the bonding technique. Although there are various techniques for thinning the SOI substrate such as mechanical polishing, chemical polishing or use of porous silicon, hydrogen implantation is employed in this explanation. First, as shown in FIG. 35, the surface of a silicon wafer 101 as a first substrate is oxidized to form a silicon oxide ($SiO_2$) layer 102 as an insulating layer. Then, hydrogen ions are implanted into the silicon wafer 101 through the silicon oxide layer 102 to form a peel layer 104 at a certain depth in the silicon wafer 101 as shown in FIG. 36. Further, the substrate surface is washed by RCA cleaning or the like and a glass substrate 103 as a second substrate is bonded to the surface of the silicon oxide layer 102 as shown in FIG. 37. Then, the obtained structure is heat-treated. At this time, microcracks are generated in the peel layer 104, whereby part of the silicon wafer 101 is separated along the peel layer 104. Thus, the silicon wafer 101 is reduced in thickness. After the separation, the silicon wafer 101 is thinned down to the desired thickness by various techniques such as polishing or etching as required. Further, additional heat treatment is carried out to recover crystal defects caused by the hydrogen implantation or the silicon surface is planarized.

In the above manner, the silicon oxide layer 102 is provided on the surface of the glass substrate (the second substrate) 103 and the silicon wafer 101 which has been reduced in thickness is left on the surface of the silicon oxide layer 102. Thus, the SOI substrate is obtained.

There is also a known method for manufacturing the SOI substrate by implanting hydrogen and boron simultaneously into the silicon wafer 101 (e.g., see G. K. Celler, "Frontiers of silicon-on-insulator", J. Appl. Phys. Vol. 93 (2003), pp. 4965). The simultaneous implantation of hydrogen and boron is carried out so that the heat treatment for separating part of the silicon wafer 101 along the peel layer 104 can be carried out at a reduced temperature.

However, if hydrogen is implanted into the silicon wafer on which semiconductor elements such as transistors have been formed in advance, the hydrogen ions implanted to peel part of the silicon wafer off may function directly or indirectly as N-type impurities. As a result, adverse effects such as a shift in threshold voltage are caused on the semiconductor elements.

A possible solution of this problem is to heat the SOI substrate to remove hydrogen. However, to completely remove hydrogen from the SOI substrate, the SOI substrate needs to be heated at a temperature as high as about 800° C. or more. Such high temperature environment may change the impurity properties of the semiconductor elements. Therefore, it is substantially impossible to remove hydrogen from the SOI substrate on which the semiconductor elements have been formed. Further, since the second substrate is subjected to a temperature as high as 800° C. or more, the choice of material for the second substrate is limited. For example, glass material having a softening point of about 500 to 700° C. cannot be used.

SUMMARY

Under these circumstances, an example embodiment presented herein has been achieved. As to a semiconductor substrate obtained by a technique of forming a peel layer in the substrate and then peeling part of the substrate off along the peel layer, a feature of the example embodiment is to eliminate adverse effects caused by the diffusion of a substance for peeling the substrate into semiconductor elements which will be or have been formed on the semiconductor substrate.

To achieve the above feature, in the example embodiment presented herein, an anti-diffusion layer is formed to inhibit a peeling substance for peeling part of the semiconductor layer from traveling to a region for forming the semiconductor elements.

More specifically, a method for manufacturing a semiconductor substrate of the example embodiment comprises: forming an anti-diffusion layer and a peel layer in a substrate; and performing heat treatment to peel part of the substrate off along the peel layer, wherein the anti-diffusion layer is formed to inhibit the diffusion of a peeling substance in the peel layer beyond the anti-diffusion layer.

The method of the example embodiment comprises the steps of: forming in a substrate an anti-diffusion layer which inhibits the diffusion of a peeling substance beyond the anti-diffusion layer; forming a peel layer containing the peeling substance in the substrate; and performing heat treatment to peel part of the substrate off along the peel layer.

The method of the example embodiment comprises: forming an anti-diffusion layer and a peel layer in a substrate; bonding the substrate to a second substrate; and performing heat treatment to peel part of the substrate off along the peel layer, wherein the anti-diffusion layer is formed to inhibit the diffusion of a peeling substance in the peel layer beyond the anti-diffusion layer.

The method of the example embodiment comprises the steps of: forming in a substrate an anti-diffusion layer which inhibits the diffusion of a peeling substance beyond the anti-diffusion layer; forming a peel layer containing the peeling substance in the substrate; and performing heat treatment to peel part of the substrate off along the peel layer after the substrate is bonded to a second substrate.

The second substrate may be a glass substrate.

The substrate is preferably a monocrystalline silicon substrate.

The substrate may be provided with at least part of a semiconductor element before the part of the substrate is peeled off along the peel layer.

The substrate may be provided with a completed semiconductor element before the part of the substrate is peeled off along the peel layer.

The peel layer and the anti-diffusion layer are preferably removed from the substrate after the part of the substrate is peeled off.

The substrate may be provided with at least part of a semiconductor element after the peel layer and the anti-diffusion layer are removed from the substrate.

The peel layer is preferably a layer in which the peak of the concentration distribution of the peeling substance extends in a plane substantially parallel to the substrate surface.

The peeling substance is preferably hydrogen.

The peeling substance may be hydrogen and inert gas.

It is preferred that the anti-diffusion layer contains a diffusion inhibiting substance for inhibiting the diffusion of the peeling substance and the diffusion inhibiting substance is boron.

The anti-diffusion layer is preferably formed by boron ion implantation performed at an implantation energy E (KeV) and a dose D ($cm^{-2}$) which satisfy the condition of $D \leqq 2.7 \times 10^8 \times E^{2.78}$.

The anti-diffusion layer may contain boron as a diffusion inhibiting substance for inhibiting the diffusion of the peeling substance and the concentration of the diffusion inhibiting substance in a semiconductor layer of the semiconductor element may be $1 \times 10^{17}$ $cm^{-3}$ or less at the surface of the semiconductor layer.

Further, the method of the example embodiment presented herein comprises the steps of: forming a protective film on the substrate; forming a semiconductor layer as part of the semiconductor element in the substrate by ion implantation; removing the protective film; and forming an insulating film on the semiconductor layer by heat treatment at a temperature of 900° C. or more, wherein the step of forming an anti-diffusion layer comprises introducing a substance for forming the anti-diffusion layer by ion implantation.

The method of the example embodiment comprises the steps of: implanting ions including boron ions into a substrate to form an anti-diffusion layer in the substrate; activating boron contained in the anti-diffusion layer; implanting ions including hydrogen ions into the substrate to form a peel layer in part of the substrate at a side of the anti-diffusion layer opposite to the substrate surface from which the ion implantation is carried out and along the anti-diffusion layer; and heat-treating the substrate to peel part of the substrate off along the peel layer.

The method of the example embodiment comprises the steps of: implanting ions including boron ions into a substrate to form an anti-diffusion layer in the substrate; activating boron contained in the anti-diffusion layer; implanting ions including hydrogen ions into the substrate to form a peel layer in part of the substrate at a side of the anti-diffusion layer opposite to the substrate surface from which the ion implantation is carried out; bonding the substrate to a second substrate; and heat-treating the substrate to peel part of the substrate off along the peel layer.

The method of the example embodiment comprises the steps of: forming at least part of a semiconductor element in a substrate; implanting ions including boron ions into the substrate along the part of the semiconductor element to form an anti-diffusion layer in the substrate; activating boron contained the anti-diffusion layer; implanting ions including hydrogen ions into part of the substrate at a side of the anti-diffusion layer opposite to the part of the semiconductor element to form a peel layer; and heat-treating the substrate to peel part of the substrate off along the peel layer.

The method of the example embodiment comprises the steps of: forming at least part of a semiconductor element in a substrate; implanting ions including boron ions into the substrate along the part of the semiconductor element to form an anti-diffusion layer; activating boron contained in the anti-diffusion layer; implanting ions including hydrogen ions into part of the substrate at a side of the anti-diffusion layer opposite to the part of the semiconductor element to form a peel layer; bonding the substrate to a second substrate; and heat-treating the substrate to peel part of the substrate off along the peel layer.

The part of the semiconductor element formed in the step of forming at least part of the semiconductor element may be a semiconductor layer.

The second substrate may be a glass substrate.

The substrate is preferably a moonocrystalline silicon substrate.

A semiconductor substrate of the example embodiment presented herein is made of monocrystalline silicon material and part of which is peeled off along a peel layer containing hydrogen, wherein the semiconductor substrate includes at least part of a semiconductor element and a peak of the concentration distribution of boron formed in a plane along the part of the semiconductor element.

The semiconductor substrate of the example embodiment comprises a monocrystalline silicon substrate provided with at least part of a semiconductor element, wherein the semiconductor substrate includes a peak of the concentration distribution of boron formed in a plane along the part of the semiconductor element and a peak of the concentration distribution of hydrogen formed in a plane in part of the monocrystalline silicon substrate at a side of the plane of the peak of the concentration distribution of boron opposite to the part of the semiconductor element.

The semiconductor substrate of the example embodiment is made of monocrystalline silicon material provided with a semiconductor layer, wherein the concentration distributions of hydrogen and boron contained in the semiconductor substrate show respective gradients from one of the surfaces of the semiconductor substrate to the other.

The semiconductor substrate of the example embodiment is prepared by forming a semiconductor layer and a peel layer in a monocrystalline silicon substrate, performing heat treatment to peel part of the monocrystalline silicon substrate off along the peel layer and bonding the monocrystalline silicon substrate to a glass substrate, wherein the monocrystalline silicon substrate contains hydrogen and boron which show respective concentration distribution gradients from one of the surfaces of the monocrystalline silicon substrate to the other.

The semiconductor substrate of the example embodiment comprises: a monocrystalline silicon substrate provided with a semiconductor element including at least a semiconductor layer; a peel layer which is formed along the semiconductor element and contains hydrogen as a peeling substance for peeling off part of the monocrystalline silicon substrate by heat treatment; and an anti-diffusion layer which is formed between the peel layer and the semiconductor element and contains boron as a diffusion inhibiting substance for inhibiting the diffusion of hydrogen into the semiconductor element during the heat treatment.

It is preferred that the semiconductor element includes a semiconductor layer and a gate electrode and the concentration of the diffusion inhibiting substance in the semiconductor layer is $1\times10^{17}$ cm$^{-3}$ or less at the surface of the semiconductor layer facing the gate electrode.

It is preferred that the semiconductor element includes a semiconductor layer and the concentration of the diffusion inhibiting substance in the semiconductor layer is $1\times10^{17}$ cm$^{-3}$ or less at the surface of the semiconductor layer.

The semiconductor substrate of the example embodiment is prepared by forming a peel layer in a monocrystalline silicon substrate, performing heat treatment to peel part of the monocrystalline silicon substrate off along the peel layer and bonding the monocrystalline silicon substrate to a glass substrate, wherein the monocrystalline silicon substrate bonded to the glass substrate contains hydrogen and boron which show respective concentration distribution gradients from one of the surfaces of the monocrystalline silicon substrate to the other.

It may be possible that a semiconductor element formed in and on the monocrystalline silicon substrate and a semiconductor element formed on the glass substrate include respective layers formed in the same process.

The semiconductor substrate of the example embodiment is made of monocrystalline silicon material and includes a peak of the concentration distribution of hydrogen formed in a plane and a peak of the concentration distribution of boron formed in a plane in part of the substrate closer to the substrate surface than the plane of the peak of the concentration distribution of hydrogen.

The semiconductor substrate of the example embodiment comprises: a peel layer which is formed in a monocrystalline silicon substrate and contains hydrogen as a peeling substance for peeling off part of the monocrystalline silicon substrate by heat treatment; and an anti-diffusion layer which contains boron as a diffusion inhibiting substance for inhibiting hydrogen from diffusing into the monocrystalline silicon substrate which has been partially peeled off by the heat treatment.

The concentration of boron as the diffusion inhibiting substance in the monocrystalline silicon substrate is preferably $1\times10^{17}$ cm$^{-3}$ at the surface of the monocrystalline silicon substrate.

The semiconductor substrate of the example embodiment presented herein comprises a substrate provided with an anti-diffusion layer and a peel layer both formed therein, the anti-diffusion layer inhibiting the diffusion of a peeling substance in the peel layer beyond the anti-diffusion layer during heat treatment performed to peel part of the substrate off along the peel layer.

The semiconductor substrate of the example embodiment comprises a substrate provided with an anti-diffusion layer for inhibiting the diffusion of a peeling substance beyond the anti-diffusion layer and a peel layer which contains the peeling substance, wherein part of the substrate is peeled off along the peel layer by heat treatment.

The semiconductor substrate of the example embodiment comprises a substrate provided with an anti-diffusion layer and a peel layer both formed therein, the anti-diffusion layer inhibiting the diffusion of a peeling substance in the peel layer beyond the anti-diffusion layer during heat treatment performed to peel part of the substrate off along the peel layer after the substrate is bonded to a second substrate.

The semiconductor substrate of the example embodiment comprises a substrate provided with an anti-diffusion layer for inhibiting the diffusion of a peeling substance beyond the anti-diffusion layer and a peel layer containing the peeling substance, wherein part of the substrate is peeled off along the peel layer by heat treatment after the substrate is bonded to a second substrate.

The semiconductor substrate of the example embodiment comprises a substrate and a second substrate bonded to the substrate, wherein the substrate is formed by the steps of: forming an anti-diffusion layer in the substrate; activating a diffusion inhibiting substance contained in the anti-diffusion layer; forming a peel layer in the substrate along the anti-diffusion layer; and heat-treating the substrate to peel part of the substrate off along the peel layer.

The semiconductor substrate of the example embodiment presented herein is formed by the steps of: implanting ions including boron ions into the substrate to form an anti-diffusion layer in the substrate; activating boron contained in the anti-diffusion layer; implanting ions including hydrogen ions into the substrate to form a peel layer in part of the substrate at a side of the anti-diffusion layer opposite to the substrate surface from which the ion implantation is carried out and along the anti-diffusion layer; and heat-treating the substrate to peel part of the substrate off along the peel layer.

The semiconductor substrate of the example embodiment is formed by the steps of: implanting ions including boron ions into the substrate to form an anti-diffusion layer in the substrate; activating boron contained in the anti-diffusion layer; implanting ions including hydrogen ions into the substrate to form a peel layer in part of the substrate at a side of the anti-diffusion layer opposite to the substrate surface from which the ion implantation is carried out; bonding the substrate to a second substrate; and heat-treating the substrate to peel part of the substrate off along the peel layer.

The semiconductor substrate of the example embodiment is formed by the steps of: forming at least part of a semiconductor element in the substrate; implanting ions including boron ions into the substrate along the part of the semiconductor element to form an anti-diffusion layer in the substrate; activating boron contained in the anti-diffusion layer; implanting ions including hydrogen ions into part of the substrate at a side of the anti-diffusion layer opposite to the part of the semiconductor element to form a peel layer; and heat-treating the substrate to peel part of the substrate off along the peel layer.

The semiconductor substrate of the example embodiment is formed by the steps of: forming at least part of a semiconductor element in a substrate; implanting ions including boron ions into the substrate along the part of the semiconductor element to form an anti-diffusion layer in the substrate; activating boron contained in the anti-diffusion layer; implanting ions including hydrogen ions into part of the substrate at a side of the anti-diffusion layer opposite to the part of the semiconductor element to form a peel layer; bonding the substrate to a second substrate; and heat-treating the substrate to peel part of the substrate off along the peel layer.

The anti-diffusion layer is preferably removed together with the peel layer.

The second substrate may be a glass substrate.

The substrate is preferably a monocrystalline silicon substrate.

Now, the effects of the present invention will be described.

In the scope of the specification and claims of an example embodiment, the "semiconductor substrate" signifies a layer capable of providing a semiconductor layer or a substrate having a semiconductor layer. That is, it is assumed that the "semiconductor substrate" mentioned herein includes: a silicon wafer to be provided with a semiconductor layer in a later step; a silicon wafer in which a semiconductor layer has been formed; a silicon wafer in which part of a semiconductor element has been formed; a silicon wafer provided with a completed semiconductor element; any one of the above-mentioned silicon wafers or a combination thereof bonded to another substrate as it is or after dicing; and any one of the above-mentioned silicon wafers or a combination thereof bonded to another substrate and then goes through additional element formation step.

According to the present method for manufacturing the semiconductor substrate, a diffusion inhibiting substance is introduced into the semiconductor substrate to form an anti-diffusion layer for inhibiting a peeling substance from diffusing toward the surface of the silicon wafer. The peeling substance may be hydrogen and introduced into the semiconductor substrate by ion implantation. Further, the diffusion inhibiting substance may be boron and introduced into the semiconductor substrate by ion implantation.

If the step of peeling part of the semiconductor substrate by heat treatment is carried out after the diffusion inhibiting substance is thus introduced into the semiconductor substrate, the diffusion inhibiting substance inhibits migration of the peeling substance which is likely to be diffused during the heat treatment.

That is, the peeling substance becomes less likely to migrate to part of the semiconductor substrate in which a semiconductor layer will be formed in a later step or to the semiconductor layer which has already been formed in the semiconductor substrate. As a result, the peeling substance becomes less possible to cause adverse effects on threshold value control.

After the peeling step, the anti-diffusion layer and the peel layer are preferably removed together. This prevents adverse effects on threshold value control by the peeling substance in the peel layer or the diffusion inhibiting substance in the anti-diffusion layer.

The step of forming the semiconductor element is preferably carried out before the step of bonding the substrate to a second substrate. By so doing, the semiconductor element is formed with high precision in advance and then transferred to the second substrate by bonding. For example, a submicron device completed in an IC process is provided on the glass substrate with high precision.

DETAILED DESCRIPTION

Hereinafter, a detailed explanation is given for embodiments of an example embodiment with reference to the drawings, but the example embodiment is not limited thereto.

FIGS. 1 to 11 are sectional views according to Embodiment 1. In Embodiment 1, a semiconductor element T is completed on a substrate and then the substrate is bonded to another substrate K (hereinafter referred to as substrate K) to obtain a semiconductor device S. For the sake of convenience, expressions related to position and direction such as top and bottom, right and left, are based on the drawings when viewed from the front.

In general, the semiconductor element T includes a plurality of NMOS transistors and/or PMOS transistors formed on a single substrate. However, for a simple explanation, it is assumed hereinafter that a single NMOS transistor is formed on the substrate. Though not clearly mentioned, the PMOS transistor can be formed in a like manner by optionally changing the conductivity of ions to be implanted. It should be understood that there is no intention of excluding the case of forming a single transistor. Although no reference is made herein, device isolation and well formation may be carried out as required.

Figure 1:
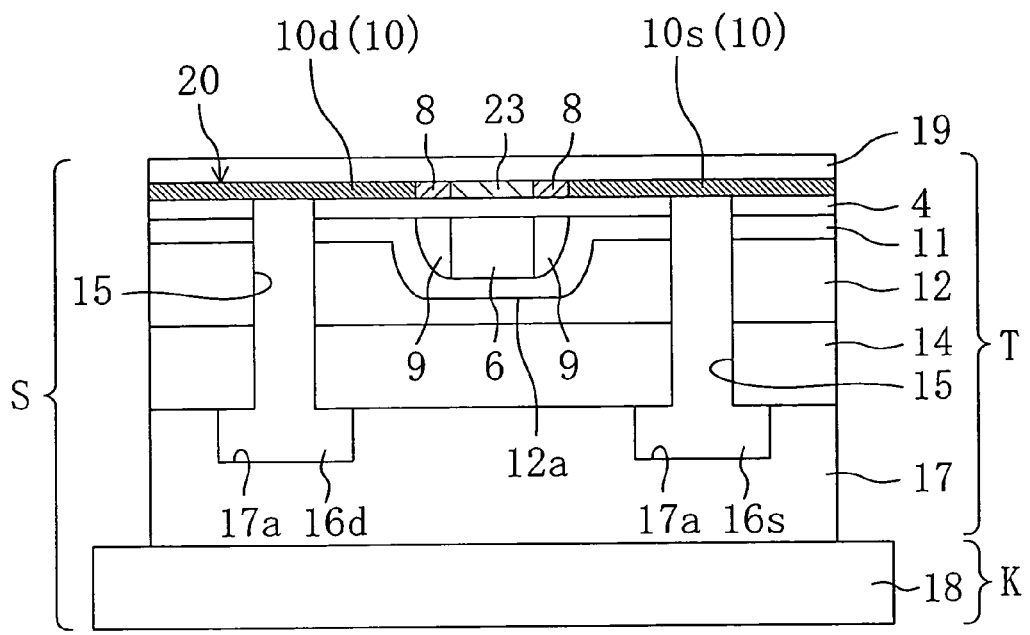
FIG. 1 is a sectional view schematically illustrating a semiconductor device of Embodiment 1.

FIG. 1 is a sectional view schematically illustrating the semiconductor device S obtained by bonding the semiconductor element T to the substrate K. That is, the semiconductor device S includes the substrate K and the semiconductor element T which is formed with high density and high accuracy.

The substrate K may be a glass substrate 18.

The semiconductor element T includes a protective film 19, a semiconductor layer 20, a gate insulating film 4, a gate electrode 6, sidewalls 9, a first interlayer insulating film 11, a second interlayer insulating film 12, a third interlayer insulating film 14, a source electrode 16s, a drain electrode 16d, an insulating film 17 and an LDD (Lightly Doped Drain) structure including a channel region 23 and low concentration impurity regions 8 to provide a MOS transistor (NMOS transistor).

The gate electrode 6 is formed between the first interlayer insulating film 11 and the gate insulating film 4. That is, as shown in FIG. 1, the second interlayer insulating film 12 is provided with a recess 12a and the first interlayer insulating film 11 is formed thereon to have a recessed portion corresponding to the recess 12a. Further, the sidewalls 9 are formed on both sides of the gate electrode 6, respectively. The gate electrode 6 is formed within the recess 12a with the first interlayer insulating film 11 interposed therebetween. The top surfaces of the sidewalls 9 and the gate electrode 6 are flush with the top surface of the first interlayer insulating film 11. Further, the semiconductor layer 20 is formed to cover the sidewalls 9, gate electrode 6 and first interlayer insulating film 11 with the gate insulating film 4 interposed therebetween.

The semiconductor layer 20 may be a monocrystalline silicon layer containing impurities. The semiconductor layer 20 includes the channel region 23, low concentration impurity regions 8 formed on both sides the channel region 23 and high concentration impurity regions 10 formed on the outer sides of the low concentration impurity regions 8.

The channel region 23 is arranged to face the gate electrode 6 with the gate insulating film 4 interposed therebetween and implanted with P-type impurities such as boron at a concentration of about 1 to $5 \times 10^{17}$ cm$^{-3}$. The low concentration impurity regions 8 are arranged to face the sidewalls 9, respectively, with the gate insulating film 4 interposed therebetween. The low concentration impurity regions 8 and the high concentration impurity regions 10 are implanted with N-type impurities such as phosphorus at concentrations of about 1 to $5 \times 10^{17}$ cm$^{-3}$ and $1 \times 10^{19}$ to $1 \times 10^{20}$ cm$^{-3}$, respectively, so that the low concentration impurity regions 8 are lower in impurity concentration than the high concentration impurity regions 10. In other words, the impurity concentration in the semiconductor layer 20 increases in the order of the channel region 23, the low concentration impurity regions 8 and the high concentration impurity regions 10.

One of the high concentration impurity regions 10 functions as a drain region 10d and the other as a source region 10s. The drain region 10d is connected to the drain electrode 16d and the source region 10s is connected to the source electrode 16s.

More specifically, as shown in FIG. 1, contact holes 15 are formed below the drain region 10d and the source region 10s, respectively, to penetrate the third interlayer insulating film 14, second interlayer insulating film 12, first interlayer insulating film 11 and gate insulating film 4. The contact holes 15 are filled with conductive material such as metal to form the drain electrode 16d and the source electrode 16s, thereby establishing electric connection with the drain region 10d and the source region 10s, respectively. Concaves 17a are formed in the insulating film 17 to extend in the form of a trench, respectively, and filled with conductive material to form wires. In this way, the semiconductor element T is obtained.

Further, the configuration of the semiconductor element T may be turned upside down with respect to the glass substrate 18.

Now, with reference to FIGS. 1 to 12, an explanation is given of a method for manufacturing the semiconductor device S and the semiconductor element T of this embodiment.

The method for manufacturing the semiconductor device S includes an insulating layer formation step, an anti-diffusion layer formation step by ion implantation, an activation step, a peel layer formation step by ion implantation, a bonding step, a separation (peeling) step and a removal step.

More specifically, the method for manufacturing the semiconductor element T is a method including the step of implanting hydrogen or hydrogen and inert gas as a peeling substance into a monocrystalline silicon substrate, followed by heating, thereby peeling part of the monocrystalline silicon substrate. The method further includes the steps of forming in the monocrystalline silicon substrate an anti-diffusion layer 35 for inhibiting the diffusion of hydrogen beyond the anti-diffusion layer 35, forming a hydrogen-containing peel layer 36 in the monocrystalline silicon substrate and performing heat treatment to peel part of the monocrystalline silicon substrate along the peel layer 36.

In this embodiment, the step of forming the semiconductor element T is carried out before the bonding step.

Figure 2:
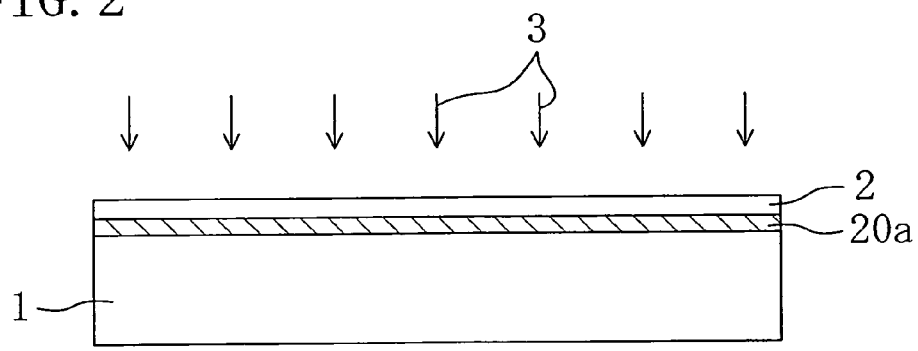
FIG. 2 is a view illustrating the step of implanting boron for forming a channel region.

First, as shown in FIG. 2, a 20 nm thick oxide film 2 is formed as a protective film at the surface of a silicon wafer (monocrystalline silicon substrate) 1. Then, for the purpose of controlling the threshold value of the MOS transistor, boron 3 as an impurity element for forming a channel region 23 is introduced into the silicon wafer 1 by ion implantation. The ion implantation is carried out at an implantation energy of about 10 to 30 KeV and a dose of about 1 to $5 \times 10^{12}$ cm$^{-3}$. Thus, a semiconductor layer 20a (which will be a semiconductor layer 20 in a later step) is formed in part of the silicon wafer 1 below the oxide film 2.

Figure 3:
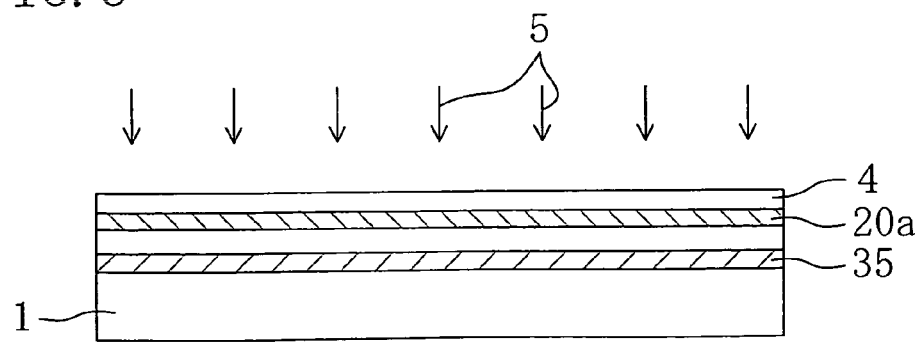
FIG. 3 is a view illustrating the step of forming an insulating layer and the step of implanting ions of a second element.

Then, in the insulating layer formation step, the oxide film 2 is removed and then a gate insulating film 4 is formed as an insulating layer on the surface of the silicon wafer 1 (the surface of the layer to be the semiconductor layer 20) as shown in FIG. 3. The gate insulating film 4 may be an oxide film which is formed on the silicon wafer 1 to have a thickness of about 20 nm by heat treatment in an oxidizing atmosphere at 1000° C.

Then, in the anti-diffusion layer formation step, boron is introduced into the silicon wafer 1 by ion implantation as a diffusion inhibiting substance which inhibits a peeling substance (hydrogen in this embodiment) from traveling in the silicon wafer 1. Thus, a boron-containing anti-diffusion layer 35 is formed in the silicon wafer 1. The anti-diffusion layer 35 is formed in part of the silicon wafer 1 below the semiconductor layer 20a. In other words, the semiconductor layer 20a is provided between the anti-diffusion layer 35 and the gate insulating film 4. The boron-containing anti-diffusion layer 35 for inhibiting the migration of hydrogen is formed after the formation of the gate insulating film 4 by heat treatment in an oxidizing atmosphere at 1000° C. Therefore, the diffusion of boron from the anti-diffusion layer toward the silicon wafer surface, which is caused by heat treatment, is suppressed as possible. This prevents deterioration in control of electric characteristics such as a threshold voltage of the MOS transistor. However, if the temperature for the heat treatment for forming the gate insulating film 4 is low enough not to cause significant thermal diffusion of boron, the anti-diffusion layer 35 may be formed prior to the formation of the gate insulating film 4 without any problems.

The anti-diffusion layer 35 is formed at such a depth in the silicon wafer 1 that no adverse effects are caused on the electric characteristics of the NMOS transistor as the semiconductor element T. That is, the implantation energy is defined to inhibit the diffusion of boron from the anti-diffusion layer 35 toward the surface of the silicon wafer 1 and avoid adverse effects on the threshold voltage of the NMOS transistor.

Figure 12:
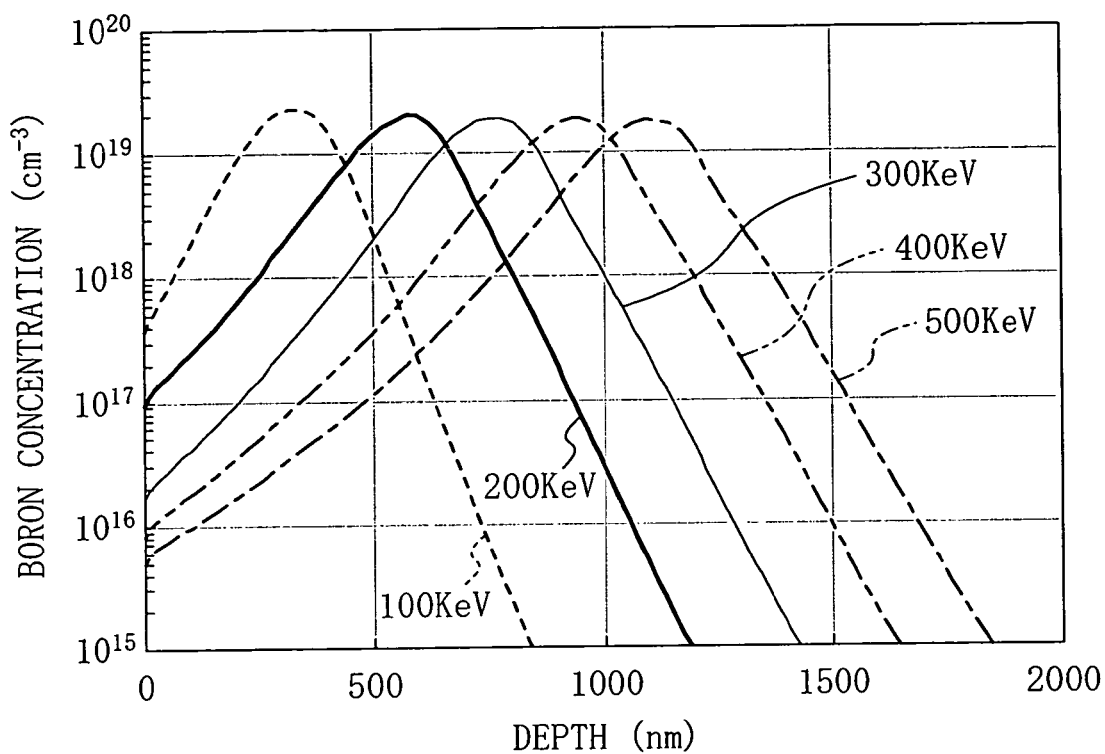
FIG. 12 is a graph illustrating a relationship between depth in a silicon substrate and boron concentration.

FIG. 12 shows a relationship between boron concentration distribution and depth in a monocrystalline silicon substrate obtained by process simulation. Boron is implanted at a dose of $5 \times 10^{14}$ cm$^{-2}$ and then heat treatment is carried out at 900° C. for 10 minutes. The implantation energy is varied to 100, 200, 300, 400 and 500 KeV and the resulting concentration distributions along the depth direction are checked.

As shown in FIG. 12, the boron concentration gradually increases with an increase in depth in the monocrystalline silicon substrate until it reaches a peak at a certain depth. After that, the boron concentration decreases with an increase in depth in the substrate. Part of the distribution curve corresponding to the top side of the silicon wafer is tilted more gently than part of the distribution curve corresponding to the bottom side of the silicon wafer. That is, the obtained curve is a Pearson distribution curve which is asymmetric to the implantation peak. In the distribution curve, the range where the boron concentration exceeds a predetermined level corresponds to the anti-diffusion layer. The predetermined concentration is, for example, one tenth of the peak of the concentration distribution. The higher the implantation energy is, the deeper the peak of the boron concentration is shifted.

At the time when the semiconductor element is completed on the surface of the silicon wafer 1, the boron concentration at the surface of the silicon wafer 1 is preferably $1 \times 10^{17}$ cm$^{-3}$ or less. If the boron concentration is higher than $1 \times 10^{17}$ cm$^{-3}$, the impurity concentration in the channel region 23 of the MOS transistor becomes too high. This makes the threshold value control difficult and the desired threshold value cannot be obtained with ease.

Figure 33:
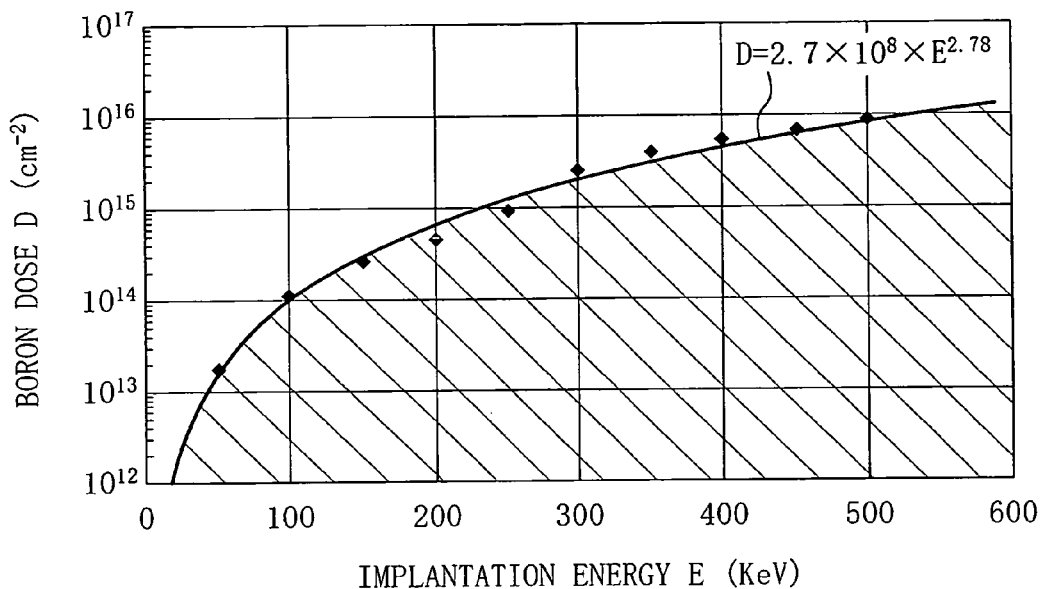
FIG. 33 is a graph illustrating the range of the dose and the implantation energy of boron ion implantation which gives the boron concentration at the surface of a silicon substrate of $10^{17}$ cm$^{-3}$ or less.

The concentration of boron as a diffusion inhibiting substance at the surface of the silicon wafer is given as a function of the dose and the implantation energy for the ion implantation and the conditions of the heat treatment performed in the manufacturing process of the semiconductor element. For example, to give the boron concentration of $1 \times 10^{17}$ cm$^{-3}$ or less to the surface of the channel region 23 facing the gate electrode 6, the boron ion implantation is carried out at a dose and an implantation energy within the range below the solid line shown in FIG. 33. Therefore, in order that the surface of the silicon wafer 1 shows the required concentration of $1 \times 10^{17}$ cm$^{-3}$ or less through the heat treatment at 900° C. for 10 minutes, a dose D (cm$^{-2}$) and an implantation energy E (KeV) of the boron ion implantation should satisfy the following condition (1):

$$D \leq 2.7 \times 10^8 \times E^{2.78} \tag{1}$$

Further, since the impurity concentration in the channel region 23 of a common MOS transistor of an IC is about 1 to $5 \times 10^{17}$ cm$^{-3}$, it is assumed that the electric characteristics of the transistor are less influenced as long as the concentration of N-type impurities derived from hydrogen implantation is less than $1 \times 10^{17}$ cm$^{-3}$. Therefore, it is assumed that measures should be taken in the case where the N-type impurity concentration derived from hydrogen implantation is about $1 \times 10^{17}$ cm$^{-3}$ or more. According to the conversion of the concentration of about $1 \times 10^{17}$ cm$^{-3}$ to a dose, the minimum required dose of boron is $1 \times 10^{12}$ cm$^{-2}$.

In summary, the boron ion implantation is preferably carried out under the condition of:

$$1 \times 10^{12} \text{ cm}^{-2} \leq D \leq 2.7 \times 10^8 \times E^{2.78} \tag{2}$$

where D is a dose (cm$^{-2}$) and E is an implantation energy (KeV).

Therefore, if the ion implantation is carried out to satisfy the condition of (2), the channel region which works favorably is formed in the silicon wafer. In the above description, the boron concentration at the surface of the channel region 23 facing the gate electrode 6 is determined as $1 \times 10^{17}$ cm$^{-3}$ or less, but the present invention is not limited thereto. More specifically, if the semiconductor layer 20 shows the boron concentration of $1 \times 10^{17}$ cm$^{-3}$ or less at the surface thereof, the obtained transistor will be operated favorably.

Figure 4:
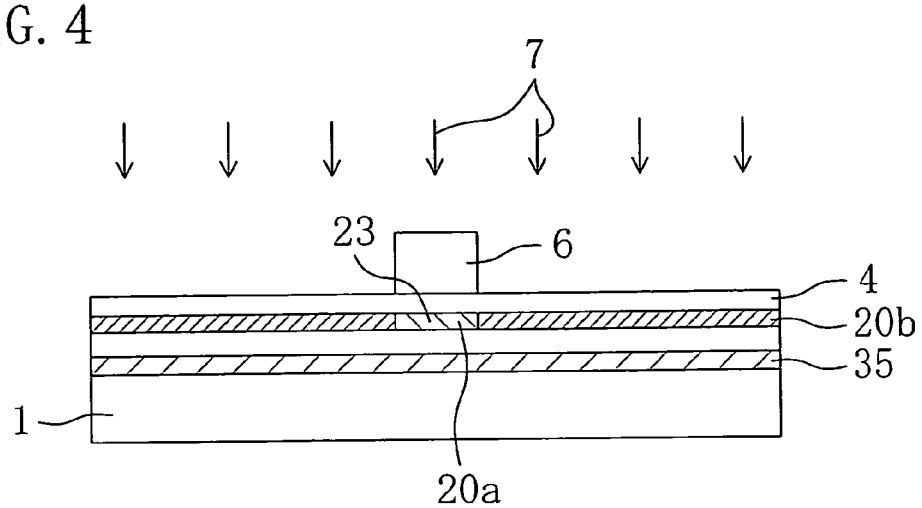
FIG. 4 is a view illustrating the step of implanting impurities using a gate electrode as a mask.

Then, as shown in FIG. 4, a gate electrode 6 is formed on the surface of the gate insulating film 4. First, a polysilicon layer of about 300 nm in thickness is deposited by CVD. Then, N-type impurities are diffused into the polysilicon layer to make the polysilicon layer N-type conductive, and then the polysilicon layer is patterned into a gate electrode 6.

Then, as shown in FIG. 4, using the gate electrode 6 as a mask, N-type impurities 7 are introduced into part of the silicon wafer 1 by ion implantation to form a semiconductor layer 20b (which will be low concentration diffusion regions 8) having a different impurity concentration from the semiconductor layer 20a. At this time, part of the semiconductor layer 20a below the gate electrode 6 in which the impurities are not implanted becomes the channel region 23.

Figure 5:
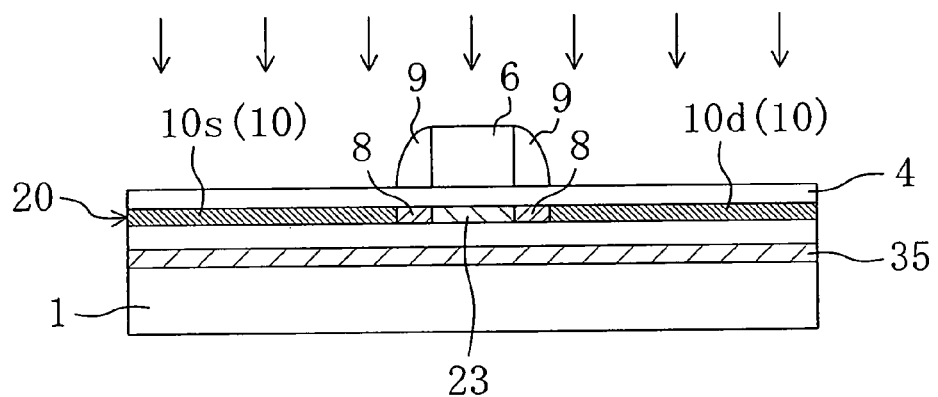
FIG. 5 is a view illustrating the step of implanting impurities using a gate electrode and sidewalls as a mask.

Then, as shown in FIG. 5, sidewalls 9 are formed on both sides of the gate electrode 6 with insulating material such as $SiO_2$. Using the gate electrode 6 and the sidewalls 9 as a mask, N-type impurities 5 are introduced into the silicon wafer 1 by ion implantation to form high concentration impurity-regions 10. At this time, part of the semiconductor layer 20b which is not implanted with the impurities 5 becomes low concentration impurity regions 8.

Figure 6:
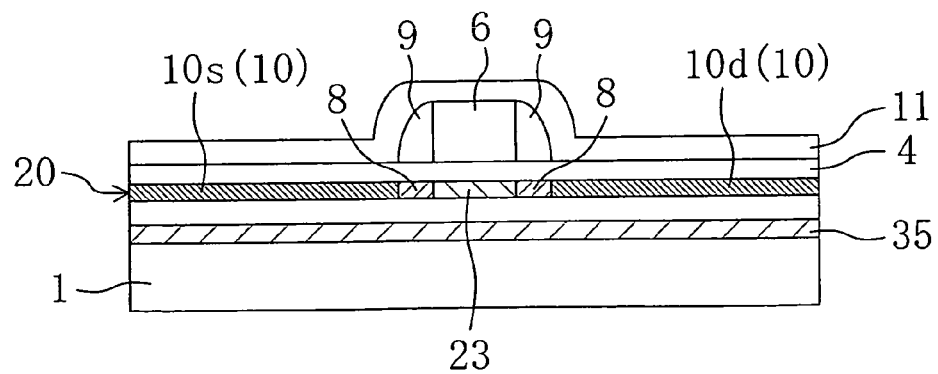
FIG. 6 is a view illustrating an activation step.

Then, as shown in FIG. 6, a first interlayer insulating film 11 of about 100 nm thickness is formed to cover the gate insulating film 4, gate electrode 6 and sidewalls 9 by CVD using insulating material such as $SiO_2$.

Then, in the activation step, impurities introduced into the silicon wafer by ion implantation are activated by heat treatment. The heat treatment is preferably carried out at 900° C. for 10 minutes, for example, to activate boron ions in the anti-diffusion layer 35. The temperature for the heat treatment is preferably low so that the diffusion of boron ions is suppressed as possible. Short-time heat treatment such as RTA (rapid thermal annealing) is also preferable. The thus implanted boron ions 13 are placed at substitution positions in silicon (Si) as donor impurities.

Figure 7:
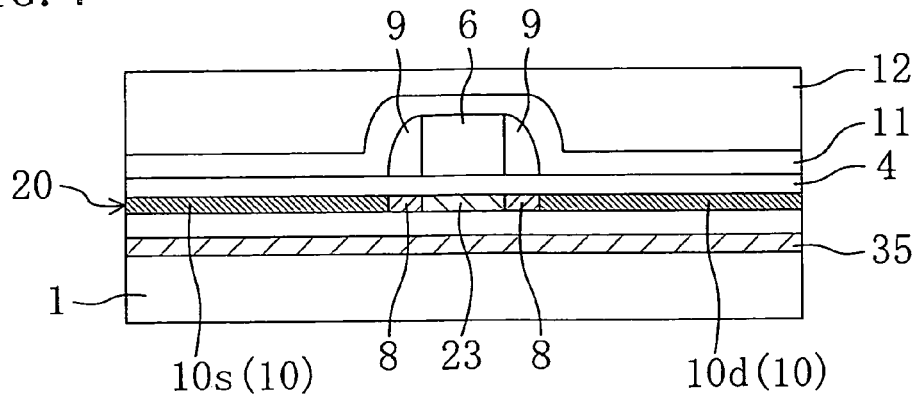
FIG. 7 is a view illustrating the step of forming a second interlayer insulating film.

Then, as shown in FIG. 7, a second interlayer insulating film 12 is formed to cover the first interlayer insulating film 11 and then the surface thereof is planarized by CMP (chemical mechanical polishing). The planarization method is not limited to CMP. Instead of forming the second interlayer insulating film 12, the first interlayer insulating film 11 may be formed thick and the surface thereof may be planarized by CMP.

Figure 8:
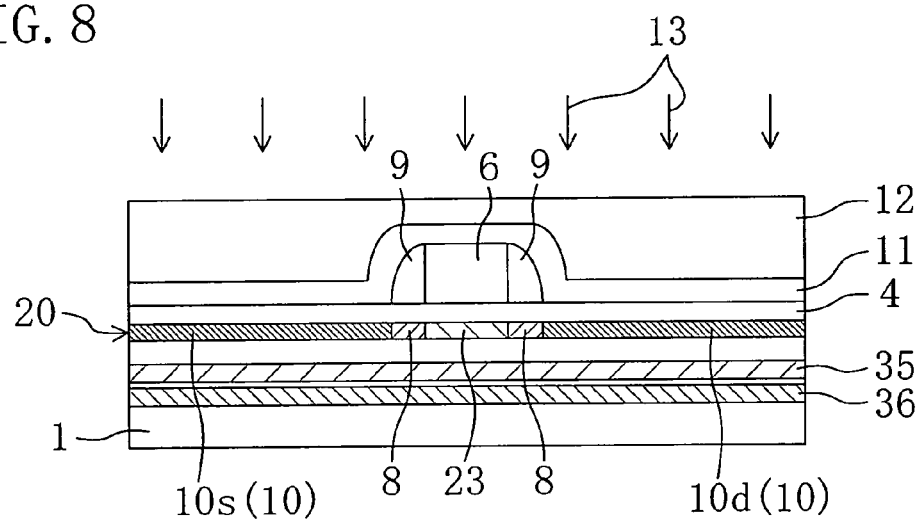
FIG. 8 is a view illustrating the step of forming a peel layer.

Then, in the peel layer formation step, hydrogen ions as a peeling substance are implanted into the silicon wafer 1 to form a peel layer 36 in part of the silicon wafer 1 at a side of the anti-diffusion layer 35 opposite to the gate insulating film 4 as shown in FIG. 8. The ion implantation is preferably carried out at a dose in the range of $1\times10^{16}$ cm$^{-2}$ or more to $6\times10^{16}$ cm$^{-2}$ or less and an implantation energy of 150 KeV or more. If the dose is less than $1\times10^{16}$ cm$^{-2}$, microcracks are not formed at the peak of hydrogen concentration in the peel layer 36 upon heat treatment, and therefore the silicon wafer cannot be separated. On the other hand, if the dose is more than $6\times10^{16}$ cm$^{-2}$, a number of crystal defects are generated near the silicon substrate surface by the ion implantation, thereby impairing the crystallinity of silicon. With the ion implantation performed under the above-described conditions, the hydrogen-containing peel layer 36 is formed at a desired depth in the silicon layer. The peel layer 36 is a layer in which the peak of the concentration distribution of the peeling substance extends in a plane substantially parallel to the wafer surface.

Figure 9:
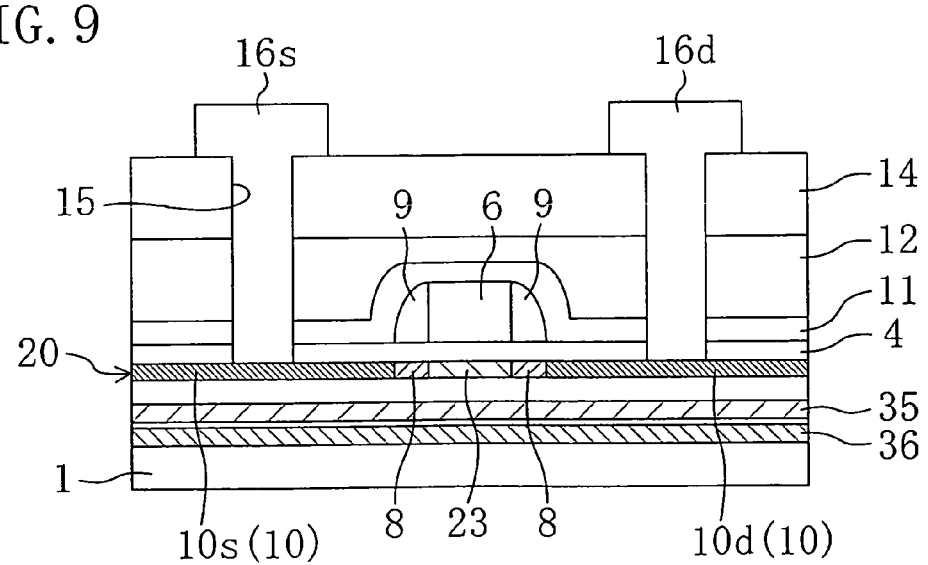
FIG. 9 is a view illustrating the step of forming a drain electrode and a source electrode.

Then, as shown in FIG. 9, a third interlayer insulating film 14 is formed to cover the second interlayer insulating film 12. Then, contact holes 15 are formed to penetrate the third interlayer insulating film 14, second interlayer insulating film 12, first interlayer insulating film 11 and gate insulating film 4 to reach the drain region 10d and the source region 10s, respectively. The contact holes 15 are then filled with conductive material such as metal to form a drain electrode 16d and a source electrode 16s. Though not shown, a nitride film of about 200 nm in thickness may be formed thereon and then hydrogenated.

Figure 10:
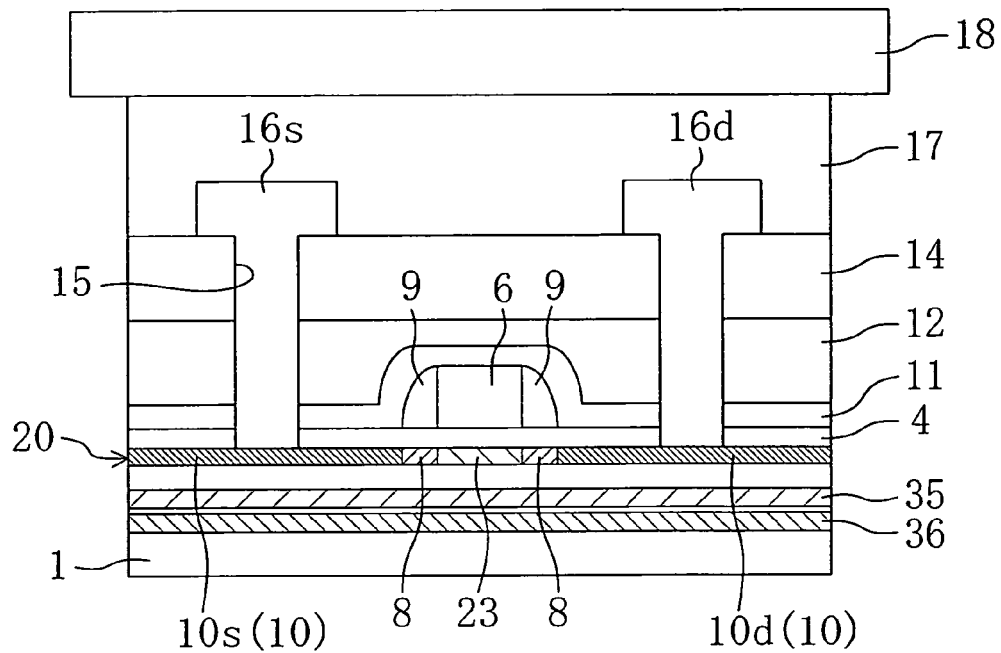
FIG. 10 is a view illustrating a bonding step.

Then, as shown in FIG. 10, an insulating film 17 made of SiO$_2$ is formed on the third interlayer insulating film 14 to cover the drain electrode 16d and the source electrode 16s. The surface of the insulating film 17 is planarized by CMP. Then, the silicon wafer 1 is cut into the desired size by dicing. Hereinafter, the thus cut silicon wafer 1 is referred to as a silicon substrate 1.

The surface of the silicon substrate 1 is washed by RCA cleaning. Subsequently, the silicon substrate 1 and a glass substrate 18 are bonded together in proper alignment in such a manner that the surface of the insulating film 17 in the semiconductor element T contacts the glass substrate 18. In this way, the glass substrate 18 is bonded to the surface of the silicon substrate 1 as shown in FIG. 10.

Figure 11:
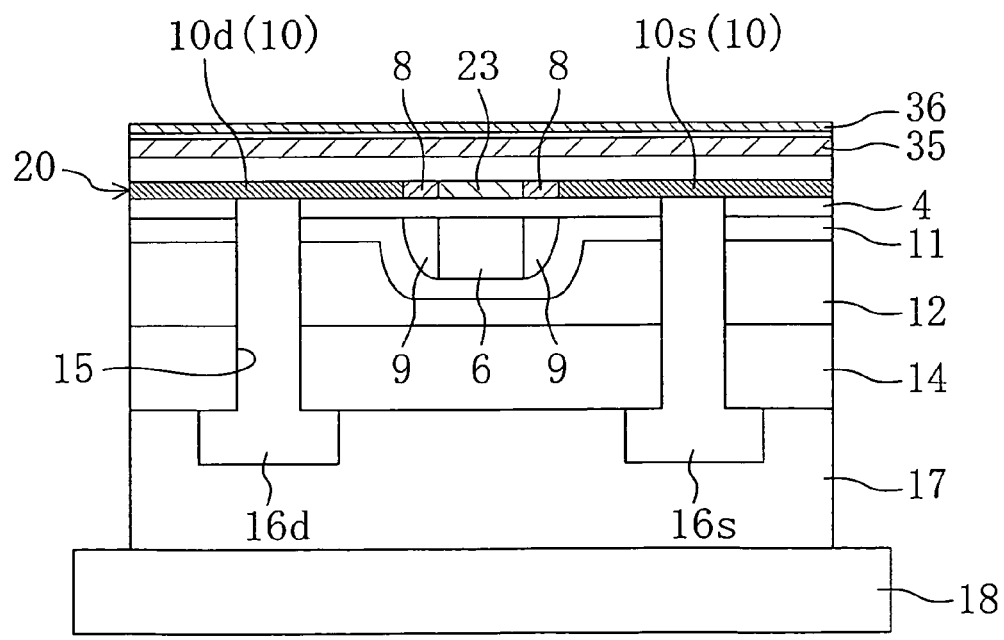
FIG. 11 is a view illustrating a separation step.

Then, in the peeling step, the obtained structure is heat-treated at 600° C. for about a few minutes to peel part of the silicon substrate 1 off along the peel layer 36 as shown in FIG. 11. By so doing, the silicon substrate 1 is thinned down and the semiconductor element T (NMOS transistor) is transferred to the glass substrate 18 together with the semiconductor layer 20. In order-to-suppress the-hydrogen diffusion so that no effect is caused on the transistor characteristics, the heat treatment is preferably carried out at a temperature as low as possible for a short period of time.

In the following removal step, as shown in FIG. 1, the anti-diffusion layer 35 and the peel layer 36 are etched away to expose the surface of the semiconductor layer 20.

The removal may be carried out by dry etching, wet etching or a combination of the both. However, if dry etching is solely employed, the surface of the semiconductor silicon layer 20 may possibly be damaged. Therefore, it is preferred to carry out wet etching in a suitable manner after the dry etching. As a result of partial removal of the silicon substrate 1, the thickness of the semiconductor silicon layer 20 is reduced to about 50 to 200 nm. The removal may be carried out by CMP (chemical mechanical polishing).

After the removal step, the N-type impurity concentration in the semiconductor layer 20 derived from the hydrogen implantation is controlled to $1\times10^{17}$ cm$^{-3}$ or less at which no significant effect is caused on the transistor characteristics.

It is preferred that the N-type impurity concentration derived from the hydrogen implantation is further reduced. Thereafter, an insulating protective film 19 is formed on the surface of the semiconductor layer 20. In order to improve the state of the interface between the semiconductor layer 20 and the protective film 19, the surface of the semiconductor layer 20 may be oxidized to form an oxide film before the formation of the protective film 19.

In this way, the anti-diffusion layer 35 and the peel layer 36 are formed in the silicon substrate 1, and then the silicon substrate 1 is heat-treated so that part of the silicon substrate 1 is peeled off along the peel layer 36 while inhibiting the diffusion of the peeling substance in the peel layer 36 beyond the anti-diffusion layer 35. With this technique, the semiconductor device S is obtained.

The semiconductor device S obtained by the above-described manufacturing method and the intermediate products such as the silicon wafer and the silicon substrate are all included in the scope of the term "semiconductor substrate" used in the example embodiment presented herein. As long as this manufacturing method is employed, the peel layer and the anti-diffusion layer are formed by ion implantation in any of the semiconductor substrates. Therefore, hydrogen and boron contained in the semiconductor substrate show respective concentration distribution gradients from one of the surfaces of the substrate to the other.

Thus, according to Embodiment 1, boron in the anti-diffusion layer 35 traps hydrogen as the peeling substance, thereby inhibiting hydrogen from diffusing into the semiconductor layer 20 beyond the anti-diffusion layer 35 during heat treatment in the peeling step. Therefore, the semiconductor layer 20 is protected from adverse effects on the electric characteristics thereof which have been caused by hydrogen diffusion into the semiconductor layer 20.

Further, in the removal step, the anti-diffusion layer 35 and the peel layer 36 are removed. Therefore, adverse effects by hydrogen are less likely caused on the semiconductor element T.

Prior to the transfer of the semiconductor layer 20 onto the glass substrate 18, the semiconductor element T is formed in advance. Therefore, the semiconductor element T, which has been produced as a submicron element in the IC process in advance, is provided on the glass substrate 18. As a result, unlike the case of forming a semiconductor element by stacking a polysilicon layer or an amorphous silicon layer on a glass substrate, the transistor obtained by the above-described thinning technique delivers performance equal to or higher than that of a transistor formed on a monocrystalline silicon substrate without any deterioration in control of the threshold value of the transistor.

Embodiment 2

FIGS. 13 to 23 are sectional views illustrating a semiconductor substrate and a method for manufacturing the same according to Embodiment 2. In the following embodiments, the same components as those shown in FIGS. 1 to 11 are given with the same reference numerals and a detailed explanation is omitted.

In this embodiment, a silicon substrate layer L in which a semiconductor layer 20 will be formed is transferred to a substrate K in advance and then the semiconductor element T is formed thereon.

In general, the semiconductor element T includes a plurality of NMOS transistors and/or PMOS transistors formed on a single substrate. However, for a simple explanation, it is assumed that a single NMOS transistor is formed on the substrate. Though not clearly mentioned, the PMOS transistor can be formed in a like manner by optionally changing the conductivity of ions to be implanted. It should be understood that there is no intention of excluding the case of forming a single transistor. Although no reference is made herein, device isolation and well formation may be carried out as required.

Figure 13:
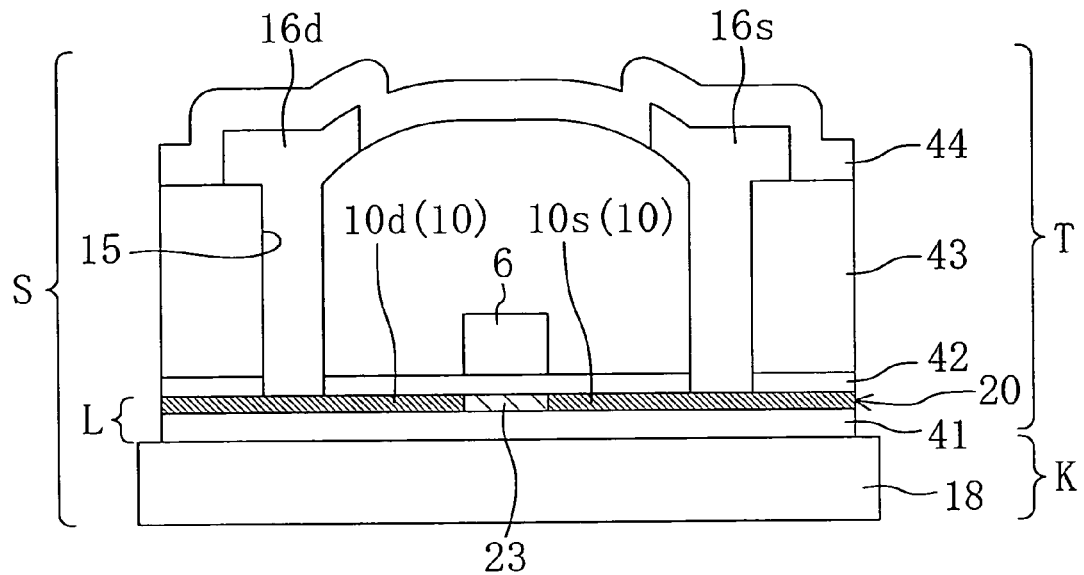
FIG. 13 is a sectional view schematically illustrating a semiconductor device of Embodiment 2.

FIG. 13 is a sectional view schematically illustrating a semiconductor device S formed of the substrate K and the semiconductor element T including the silicon substrate layer L.

The substrate K may be a glass substrate 18.

The semiconductor element T includes an oxide film 41, a semiconductor layer 20, a gate insulating film 42, a gate electrode 6, an interlayer insulating film 43, a source electrode 16s, a drain electrode 16d, a silicon nitride film 44, a channel region 23, a drain region 10d and a source region 10s to provide a MOS transistor (NMOS transistor).

The semiconductor layer 20 includes the channel region 23 and high concentration impurity regions 10 formed on both sides of the channel region 23. The high concentration impurity regions 10 include the drain region 10d and the source region 10s. Further, contact holes 15 are formed in the interlayer insulating film 43 at positions above the drain region 10d and the source region 10s, respectively, and the drain electrode 16d and the source electrode 16s are formed in the contact holes 15 to be connected to the drain region 10d and the source region 10s, respectively.

Further, a silicon nitride film 44 is formed on the interlayer insulating film 43 to cover the drain electrode 16d and the source electrode 16s.

Now, with reference to FIGS. 13 to 23, an explanation is given of a method for manufacturing the semiconductor device S and the semiconductor element T including the silicon substrate layer L.

In the same manner as in Embodiment 1, the method for manufacturing the silicon substrate layer L of this embodiment includes an insulating layer formation step, an anti-diffusion layer formation step, an activation step, a peel layer formation step, a bonding step, a peeling (separation) step and a removal step. Further, in the same manner as in Embodiment 1, the method for manufacturing the semiconductor device S of this embodiment includes, in addition to the method for manufacturing the silicon semiconductor layer L, an element formation step including the steps of forming a gate insulating film, a gate electrode, source and drain regions, an interlayer insulating film, contact holes, source and drain electrodes and a silicon nitride film. This embodiment is different from Embodiment 1 in timing when the element formation step including these steps is carried out.

More specifically, in Embodiment 1, the element formation step is performed concurrently with the anti-diffusion layer formation step, activation step and peel layer formation step. However, in Embodiment 2, the element formation step including the above-mentioned steps is carried out after the removal step.

Figure 14:
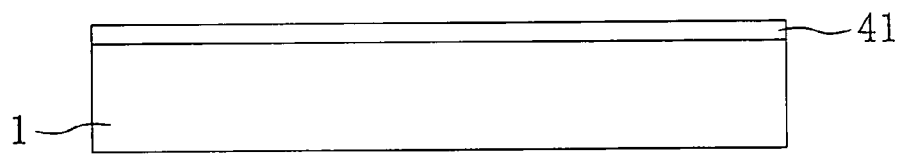
FIG. 14 is a view illustrating the step of forming an insulating layer.
Figure 15:
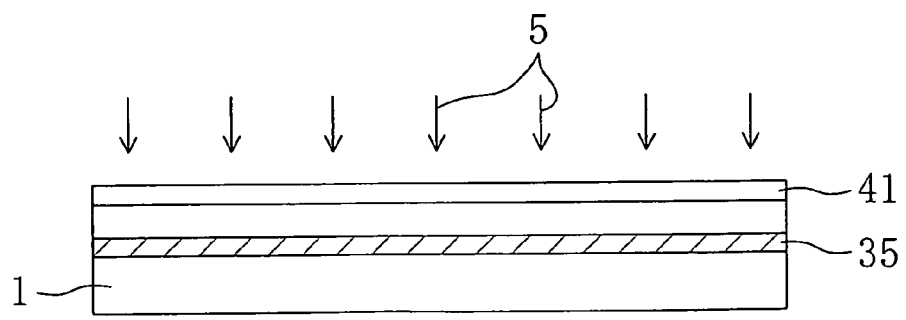
FIG. 15 is a view illustrating the step of forming an anti-diffusion layer and an activation step.

First, in the insulating layer formation step, an oxide film 41 of about 20 nm in thickness is formed as an insulating layer for protecting the substrate surface of the silicon wafer 1 as shown in FIG. 14.

Then, in the anti-diffusion layer formation step, boron 5 as a diffusion inhibiting substance is implanted into the silicon wafer 1 to form an anti-diffusion layer 35. Conditions for the implantation of boron 5 are substantially the same as those employed in Embodiment 1. As long as the concentration of the diffusion inhibiting substance is $1 \times 10^{17}$ cm$^{-3}$ or less at the surface of the silicon wafer 1, the threshold value of a semiconductor element to be formed in a later step can be controlled without any adverse effects.

In the following activation step by heat treatment, boron in the anti-diffusion layer 35 is activated. Conditions for the heat treatment are the same as those employed in Embodiment 1. In a like manner, the heat treatment is preferably carried out at a low temperature so that the diffusion of boron is inhibited as possible.

Figure 20:
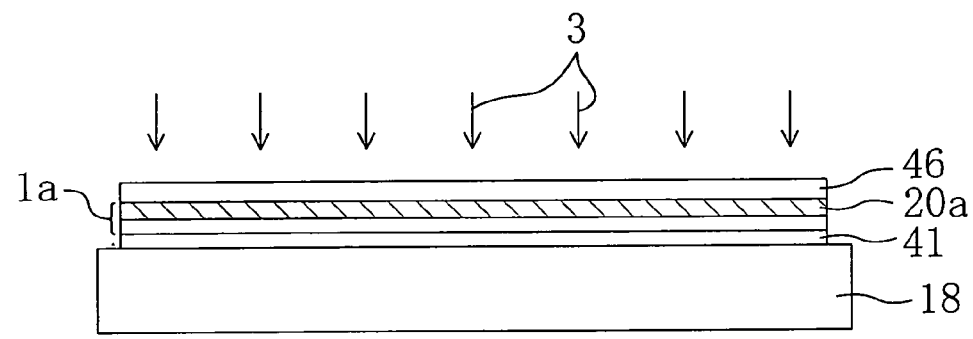
FIG. 20 is a view illustrating the step of implanting boron for forming a channel region.

Prior to the heat treatment, may be carried out the ion implantation of boron 3 for forming a channel region 23 in the silicon wafer 1, which will be performed later as shown in FIG. 20. If the ion implantation to be performed to the glass substrate 18 after the bonding step is conducted with an ion doping apparatus, other elements than the desired impurity element may be introduced simultaneously into the channel region 23, thereby making the control of the threshold voltage difficult. However, when an ion implantation apparatus is used, only the desired element is implanted into the silicon wafer 1 by using a mass separator. This advantage allows improved control of the threshold voltage.

Figure 16:
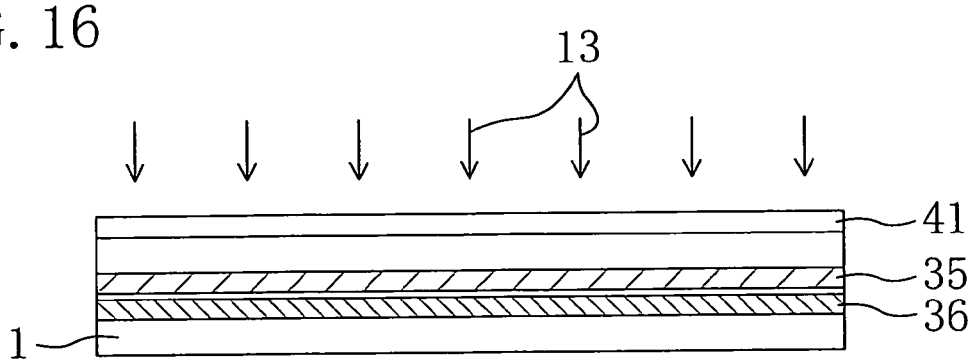
FIG. 16 is a view illustrating the step of forming a peel layer.

In the following peel layer formation step, as shown in FIG. 16, hydrogen as a peeling substance 13 is introduced into the silicon wafer 1 by ion implantation. By so doing, the peel layer 36 is formed in part of the silicon wafer 1 below the anti-diffusion layer 35.

The silicon wafer 1 which has gone through the above-described steps is useful for providing a thin monocrystalline silicon film on a glass substrate. For example, a thin monocrystalline silicon film of uniform thickness is easily formed on a glass substrate by bonding the silicon wafer to the glass substrate and then performing heat treatment at about 600° C. At this time, boron ions inhibit hydrogen ions from traveling to the thin monocrystalline silicon film by thermal diffusion, thereby preventing the thin monocrystalline silicon film from becoming N-type conductive due to hydrogen. As a result, threshold values of NMOS and PMOS transistors to be formed later are easily controlled to the desired ones and the transistors are formed with high reproducibility while variations in threshold value derived from hydrogen are suppressed. Further, since the silicon wafer 1 obtained through the above-described steps is in the form of a wafer, it offers ease of handling. For example, the silicon wafer 1 is easily carried to the other place using a silicon wafer carrier or the like.

Figure 17:
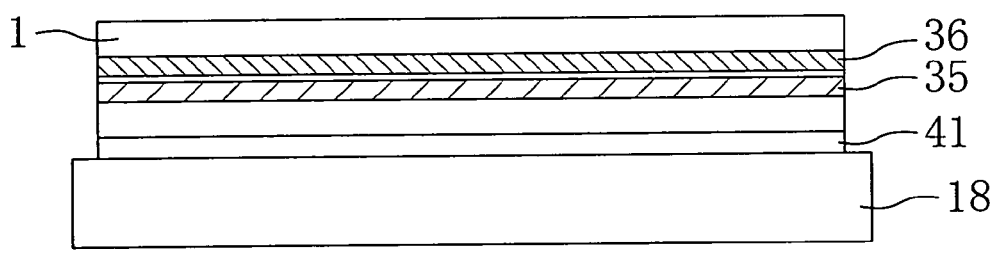
FIG. 17 is a view illustrating a bonding step.
Figure 18:
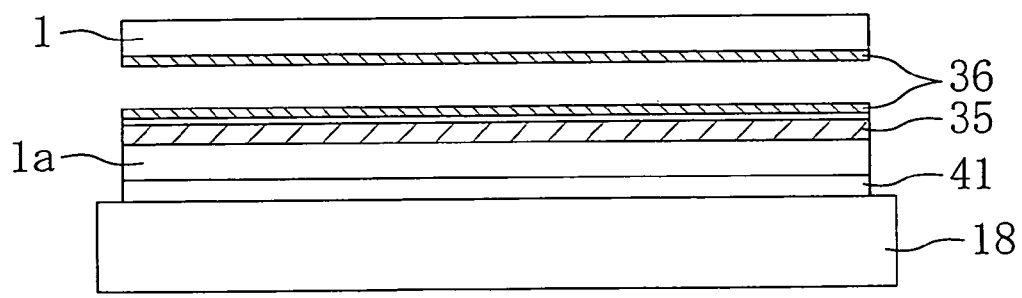
FIG. 18 is a view illustrating a separation step.

Then, the silicon wafer 1 is cut into a silicon substrate i by dicing. The surface of the silicon substrate 1 is washed by RCA cleaning and then the silicon substrate 1 is bonded to the glass substrate 18. In the bonding step, as shown in FIG. 17, the substrate 1 is turned upside down so that the lower surface thereof (the surface of the oxide film 41) is bonded to the glass substrate 18. Then, in the separation step, the obtained structure is heat-treated at 600° C. for a few minutes to peel part of the silicon substrate 1 off along the peel layer 36 as shown in FIG. 18. The remaining part of the silicon substrate 1 on the glass substrate 18 functions as a thin silicon substrate 1a.

Figure 19:
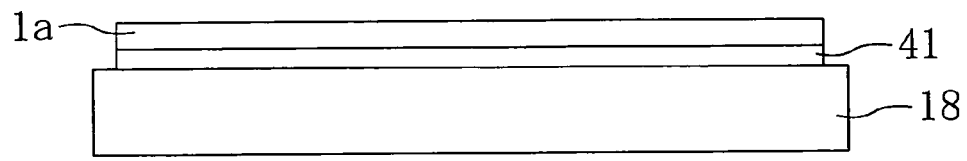
FIG. 19 is a view illustrating a removal step.

Then, in the removal step, as shown in FIG. 19, the anti-diffusion layer 35 and the peel layer 36 are etched away in the same manner as in Embodiment 1 to obtain a silicon substrate layer L. After the removal of the anti-diffusion layer 35 and the peel layer 36, the silicon substrate layer L may be further etched down to the desired thickness.

Subsequently, the semiconductor device S is completed through the following semiconductor element formation step.

More specifically, as shown in FIG. 20, an oxide film 46 of about 20 nm in thickness is formed by CVD to protect the surface of the thin silicon substrate 1a. Then, boron ions 3 for forming a channel region 23 in the thin silicon substrate 1a are implanted. By so doing, a semiconductor layer 20a is formed in part of the thin silicon substrate 1a below the oxide film 46.

Figure 21:
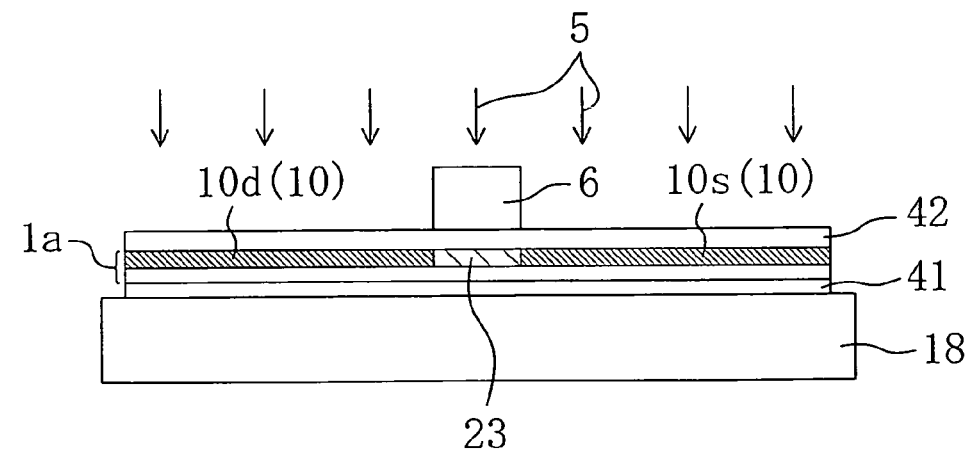
FIG. 21 is a view illustrating the step of implanting impurities using a gate electrode as a mask.

Then, as shown in FIG. 21, the oxide film 46 is removed and a gate insulating film 42 is formed on the surface of the thin silicon substrate 1a. The gate insulating film 42 is a SiO$_2$ film of about 60 nm in thickness formed by CVD. Then, a gate electrode 6 is formed using polysilicon containing N-type or P-type impurities at high concentration, metal such as W, Ta or TaN or silicide.

Using the gate electrode 6 as a mask, N-type impurities 5 are implanted into the semiconductor layer 20a to form high concentration impurity regions 10. The high concentration impurity regions 10 include a drain region 10d and a source region 10s. At this time, a channel region 23 is provided in part of the semiconductor layer 20a below the gate electrode 6. If N-type low concentration impurity regions are formed between the high concentration impurity regions 10 and the channel region 23, an LDD structure is obtained.

Figure 22:
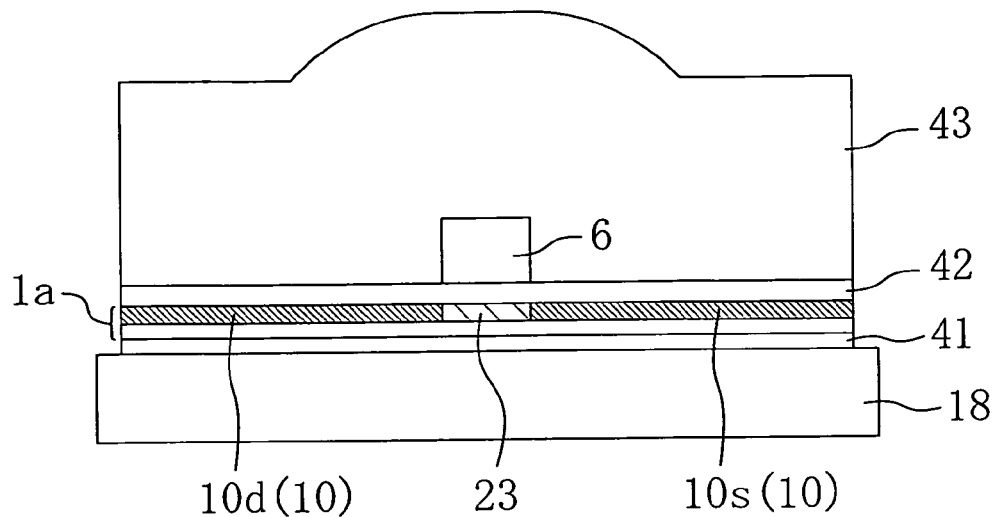
FIG. 22 is a view illustrating the step of forming an interlayer insulating film.

Then, as shown in FIG. 22, an interlayer insulating film 43 of about 700 nm in thickness is formed on the gate insulating film 42. Then, the impurities are activated by heat treatment using a laser or an oven, or by RTA.

Figure 23:
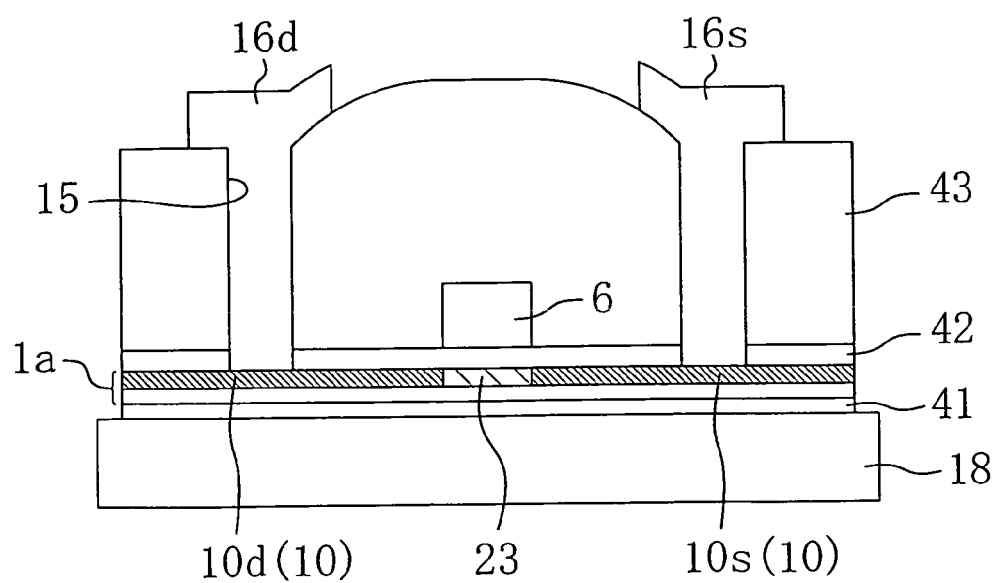
FIG. 23 is a view illustrating the step for forming a drain electrode and a source electrode.

Then, as shown in FIG. 23, contact holes 15 are formed to penetrate the interlayer insulating film 43 and the gate insulating film 42 at positions above the drain region 10d and the source region 10s, respectively. The contact holes 15 are then filled with conductive material such as metal to form a drain electrode 16d and a source electrode 16s.

Then, as shown in FIG. 13, a silicon nitride film 44 of about 200 nm in thickness is formed and then hydrogenated. In this way, the semiconductor device S is completed.

The semiconductor device S obtained by the above-described manufacturing method and the intermediate products such as the silicon wafer, the silicon substrate and the glass substrate bonded with the thin silicon substrate are all included in the scope of the term "semiconductor substrate" used in the example embodiment present herein. As long as this manufacturing method is employed, the peel layer and the anti-diffusion layer are formed by ion implantation in any of the semiconductor substrates. Therefore, hydrogen and boron contained in the semiconductor substrate show respective concentration distribution gradients from one of the surfaces of the substrate to the other.

Thus, according to Embodiment 2, activated boron traps hydrogen, thereby inhibiting hydrogen from traveling to a region for forming the semiconductor layer 20 in a later step. As a result, transistors of excellent characteristics are obtained in the later element formation step without deteriorating the control of the threshold value.

According to the above-described manufacturing method, a thin monocrystalline silicon substrate which offers accurate control of the threshold value and reduced characteristic variations is formed on the glass substrate. Therefore, unlike the case of forming a transistor by stacking a polysilicon layer or an amorphous silicon layer on a glass substrate, the transistor obtained by this manufacturing method is given with electric characteristics equal to or higher than those of a transistor formed on a monocrystalline silicon substrate.

Further, since a plurality of thin monocrystalline silicon substrates can be bonded to the glass substrate, the monocrystalline silicon layer is provided at a desired position on the glass substrate without any limitations by the size of the glass substrate. For example, regardless of the size of the glass substrate, the thin monocrystalline silicon substrate may be arranged easily.

Embodiment 3

FIGS. 24 to 32 are sectional views illustrating a semiconductor substrate and a method for manufacturing the same according to Embodiment 3.

In this embodiment, part of the semiconductor element T is formed before the bonding step and the other part of the semiconductor element T is formed after the bonding step.

Figure 24:
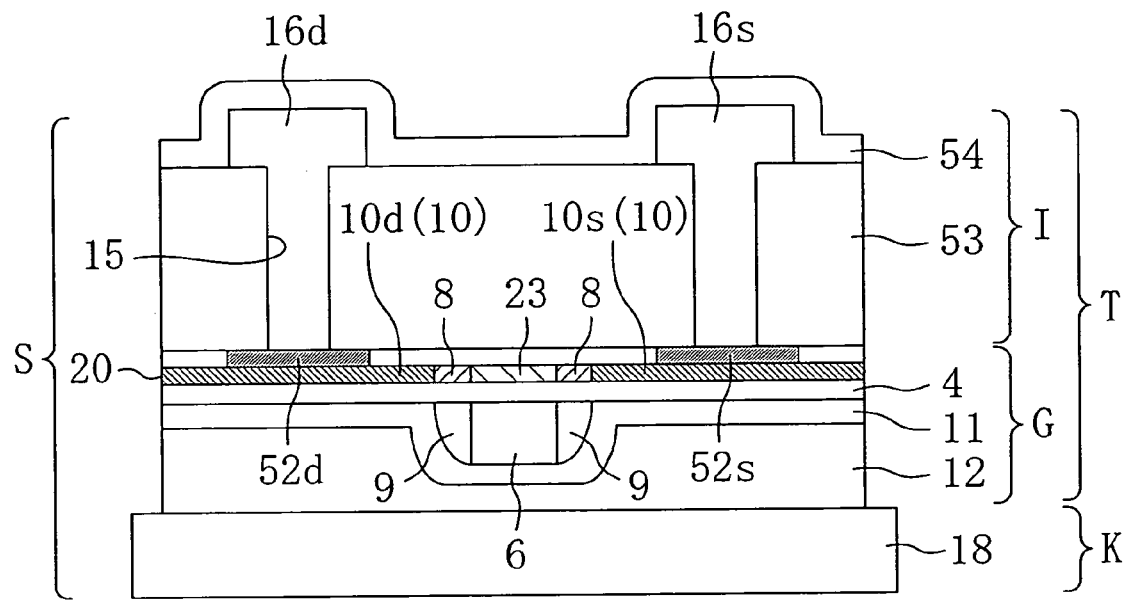
FIG. 24 is a sectional view schematically illustrating a semiconductor device of Embodiment 3.

FIG. 24 is a sectional view schematically illustrating a semiconductor device S including a substrate K and a semiconductor element T. In general, the semiconductor element T includes a plurality of NMOS transistors and/or PMOS transistors formed on a single substrate. However, for a simple explanation, it is assumed hereinafter that a single NMOS transistor is formed on the substrate. Though not clearly mentioned, the PMOS transistor can be formed in a like manner by optionally changing the conductivity of ions to be implanted. It should be understood that there is no intention of excluding the case of forming a single transistor. Although no reference is made herein, device isolation and well formation may be carried out as required.

The substrate K may be a glass substrate 18.

The semiconductor element T includes a second interlayer insulating film 12, a first interlayer insulating film 11, a gate electrode 6, sidewalls 9, a gate insulating film 4, a semiconductor layer 20, an interlayer insulating film 53, a source electrode 16s, a drain electrode 16d, a silicon nitride film 44 and a channel region 23 to provide a MOS transistor (NMOS transistor) having an LDD region.

In the same manner as in Embodiment 1, the gate electrode 6 is formed between the first interlayer insulating film 11 and the gate insulating film 4 and the sidewalls 9 are formed on both sides thereof. The semiconductor layer 20 includes the channel region 23, low concentration impurity regions 8 formed on both sides of the channel region 23 and high concentration impurity regions 10 formed on the outer sides of the low concentration impurity regions 8.

As shown in FIG. 24, high concentration impurity regions 52d and 52s are formed on a drain region 10d and a source region 10s in the semiconductor layer 20, respectively. Further, a drain electrode 16d and a source electrode 16s are formed in contact holes 15 formed in the interlayer insulating film 53, respectively.

The drain electrode 16d is connected to the drain region 10d through the high concentration impurity region 52d, while the source electrode 16s is connected to the source region 10s through the high concentration impurity region 52s. Therefore, the high concentration impurity regions 52d and 52s are electrically connected to the drain electrode 16d the source electrode 16s, respectively. The drain electrode 16d and the source electrode 16s are covered with a silicon nitride film 54 together with the interlayer insulating film 53.

As shown in FIG. 24, the semiconductor element T includes a part G including the semiconductor layer and the gate electrode and a part I including the contact holes and the electrodes.

Thus, the semiconductor device S and the semiconductor element T are configured as described above.

Now, referring to FIGS. 24 to 32, an explanation is given of a method for manufacturing the semiconductor device S of this embodiment and a method for manufacturing the semiconductor element T including the part G and the part I.

In this embodiment, the part G of the semiconductor element T is formed before the bonding step, while the part I of the semiconductor element T is formed after the bonding step.

In the same manner as in Embodiment 1, the method for manufacturing the semiconductor element T of this embodiment includes an insulating layer formation step, an anti-diffusion layer formation step, an activation step, a peel layer formation step, a bonding step, a separation (peeling) step and a removal step.

First, the same steps as those of Embodiment 1 are employed until the sidewalls 9 and the high concentration impurity regions 10 are formed (see FIGS. 2 to 5).

Figure 25:
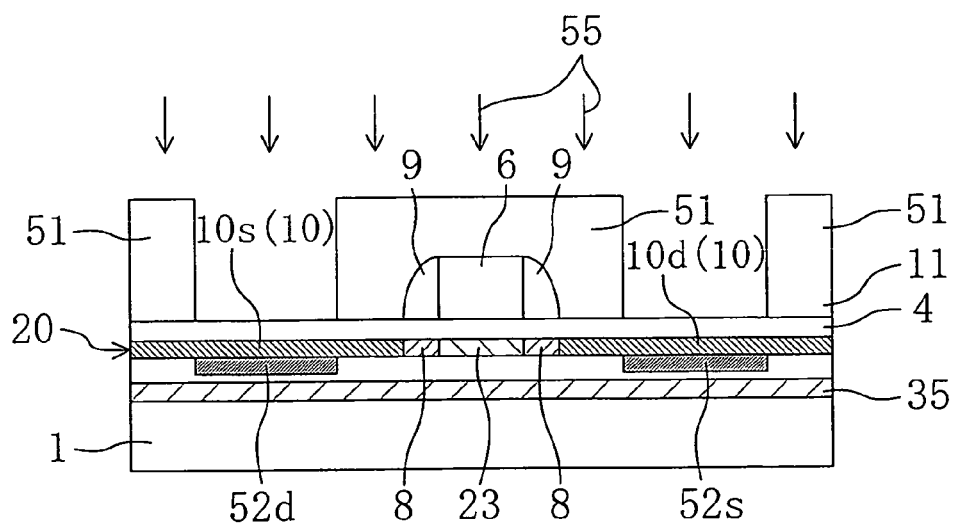
FIG. 25 is a view illustrating the step of forming high concentration impurity regions.

Then, as shown in FIG. 25, a patterned resist mask 51 is provided and then N-type impurities 55 are introduced by ion implantation into certain regions of the silicon wafer 1 below the high concentration impurity regions 10 to form high concentration impurity regions 52d and 52s. With the thus formed high concentration impurity regions 52d and 52s, the high concentration impurity regions 10 serving as the source region 10s and the drain region 10d of the NMOS transistor are electrically connected with reliability to the source electrode 16s and the drain electrode 16d, respectively, which are metal wires to be formed after the step of bonding the semiconductor element T to the glass substrate 18.

For example, the ion implantation of the N-type impurities 55 may be carried out twice using phosphorus as an ion source, first at an implantation energy of 45 KeV and a dose of $2\times10^{-15}$ cm$^{-2}$ and then at 100 KeV and $2\times10^{15}$ cm$^{-2}$. By so doing, electric continuity is established between the high concentration impurity regions 10 and part of the silicon wafer 1 at a depth of about 170 nm from the high concentration impurity regions 10. The step of forming the high concentration impurity regions 52d and 52s is not always necessary.

Figure 26:
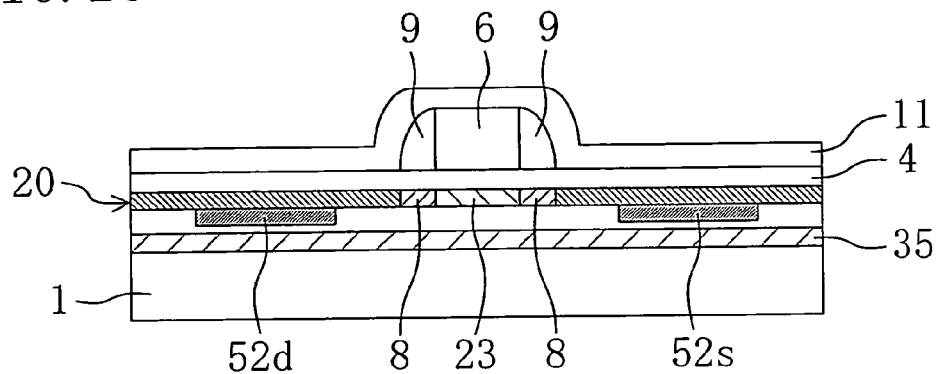
FIG. 26 is a view illustrating an activation step.

Then, as shown in FIG. 26, the resist mask 51 is removed and then a first interlayer insulating film 11 of about 100 nm in thickness is formed to cover the gate insulating film 4 and the gate electrode 6. Thereafter, in the activation step, heat treatment is carried out to activate the impurities such as boron ions in the anti-diffusion layer 35 in the silicon wafer 1. The heat treatment is carried out at 900° C. for 10 minutes, for example.

Figure 27:
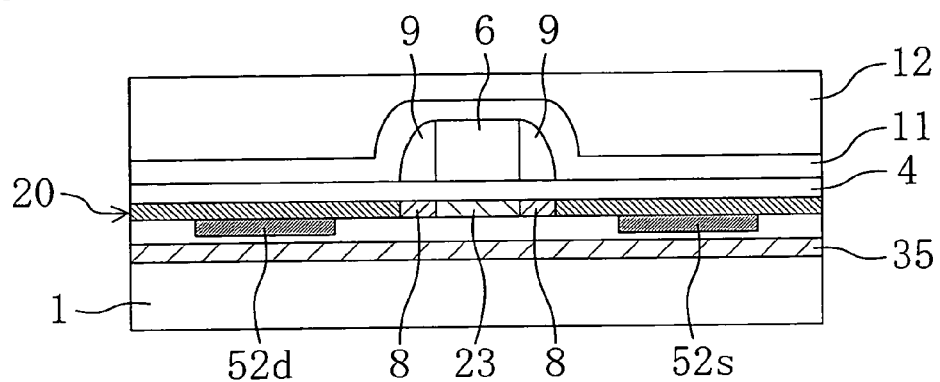
FIG. 27 is a view illustrating the step of forming a second interlayer insulating film.
Figure 28:
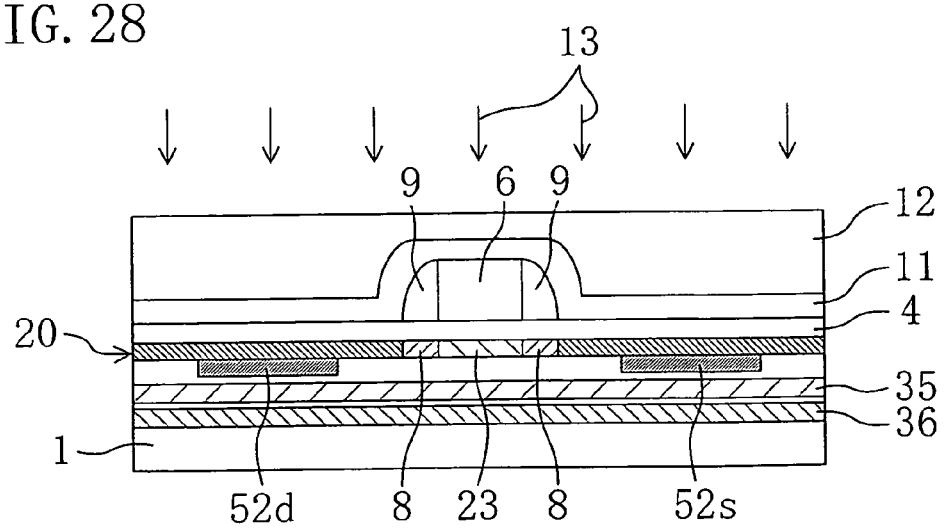
FIG. 28 is a view illustrating the step of forming a peel layer.

Then, as shown in FIG. 27, a second interlayer insulating film 12 is formed and then the surface thereof is planarized. Further, in the peel layer formation step, as shown in FIG. 28, hydrogen 13 as a peeling substance is introduced into the silicon wafer 1 by ion implantation in the same manner as in Embodiment 1. By so doing, a peel layer 36 is formed in part of the silicon wafer 1 below the anti-diffusion layer 35.

Then, the silicon wafer 1 is cut into a silicon substrate 1 by dicing. Then, the surface of the silicon substrate 1 is washed by RCA cleaning, followed by the bonding step.

Figure 29:
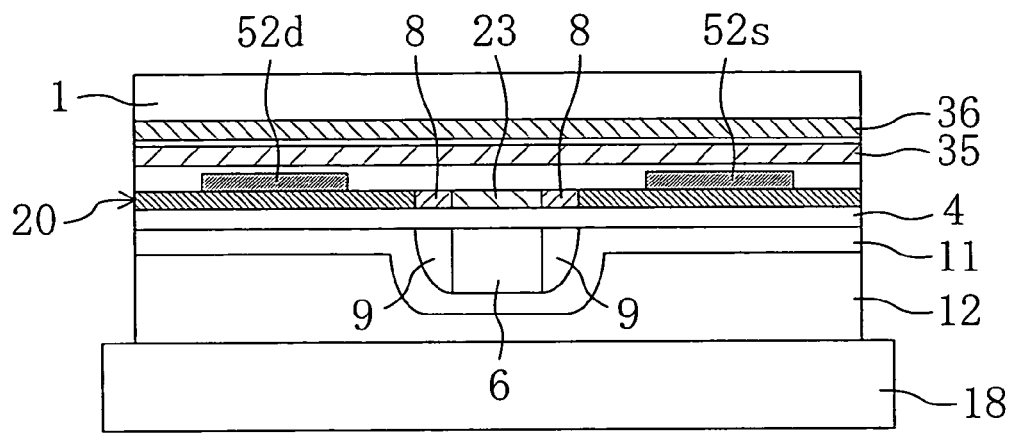
FIG. 29 is a view illustrating a bonding step.
Figure 30:
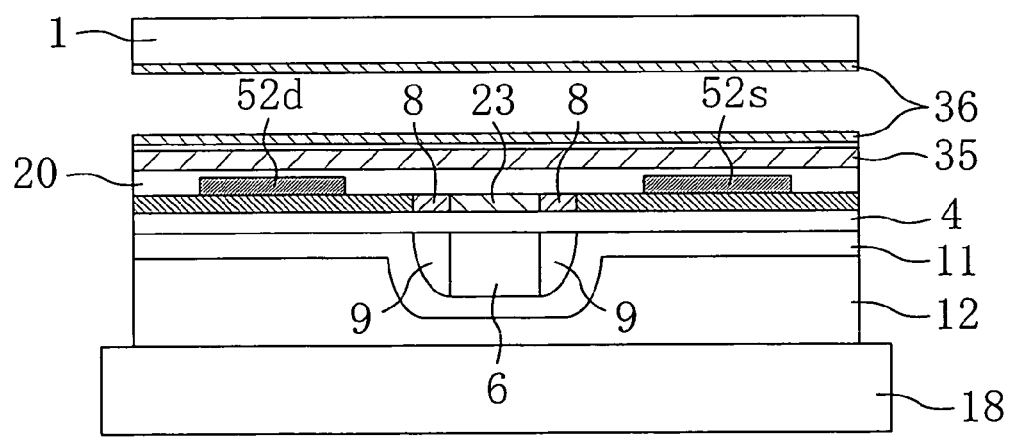
FIG. 30 is a view illustrating a separation step.

In the bonding step, the silicon substrate 1 is turned upside down to bond a glass substrate 18 to the surface of the second interlayer insulating film 12 as shown in FIG. 29. Then, in the peeling step, part of the silicon substrate 1 is separated along the peel layer 36 in the same manner as in Embodiment 1 as shown in FIG. 30. As a result, part of the silicon substrate 1 including the part G ranging from the semiconductor layer 20 to the gate electrode 6 is left on the glass substrate 18.

Figure 31:
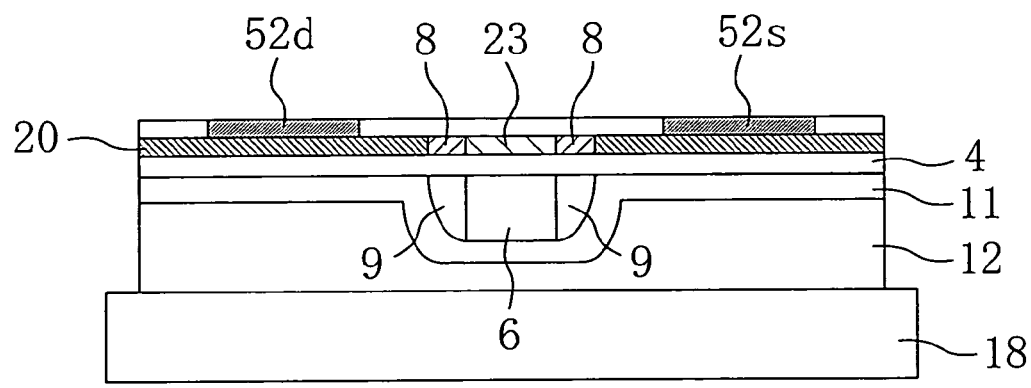
FIG. 31 is a view illustrating a removal step.

Then, in the removal step, the anti-diffusion layer 35 and the peel layer 36 in the silicon substrate 1 transferred to the glass substrate 18 are etched away, thereby exposing the high concentration impurity regions 52d and 52s as shown in FIG. 31.

Figure 32:
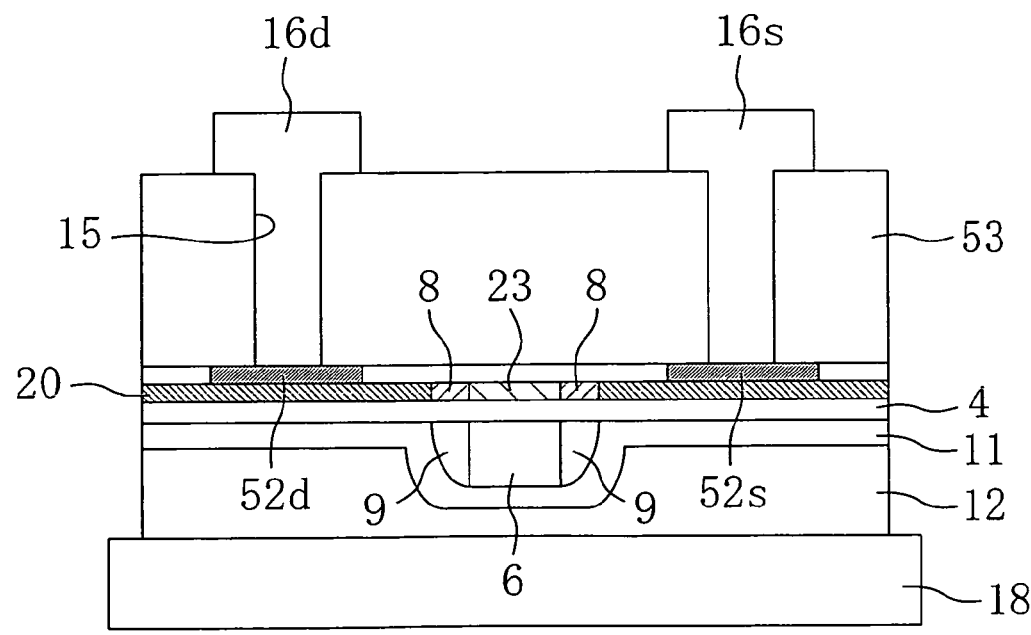
FIG. 32 is a view illustrating the step of forming a drain electrode and a source electrode.

Then, as shown in FIG. 32, an interlayer insulating film 5 of about 700 nm in thickness is formed by CVD on the surface of the semiconductor layer 20. Then, contact holes 15 are formed in the interlayer insulating film 53 to reach the high concentration impurity regions 52d and 52s, respectively, and filled with conductive material such as metal to form a drain electrode 16d and a source electrode 16s.

Then, a silicon nitride film 54 of about 200 nm in thickness is formed as shown in FIG. 24 and then hydrogenated. Thus, the semiconductor device S and the semiconductor element T are obtained.

The semiconductor device S obtained by the above-described manufacturing method and the intermediate products such as the silicon wafer and the silicon substrate are all included in the scope of the term "semiconductor substrate" used in the example embodiment presented herein. As long as this manufacturing method is employed, the peel layer and the anti-diffusion layer are formed by ion implantation in any of the semiconductor substrates. Therefore, hydrogen and boron contained in the semiconductor substrate show respective concentration distribution gradients from one of the surfaces of the substrate to the other.

Thus, in the same manner as in the foregoing embodiments, this embodiment allows obtaining a thin semiconductor silicon film which is free from adverse effects by the peeling substance, excellent in control of threshold value and small in variations in threshold value. The obtained thin semiconductor silicon film can be used as a semiconductor layer.

Further, a high performance transistor with a submicron gate length, which has been prepared in a silicon IC process until the formation of the gate electrode, is provided on the glass substrate. Since the semiconductor layer is made of monocrystalline silicon, electric characteristics of the obtained transistor are comparable to those of a transistor formed on silicon.

Figure 34:
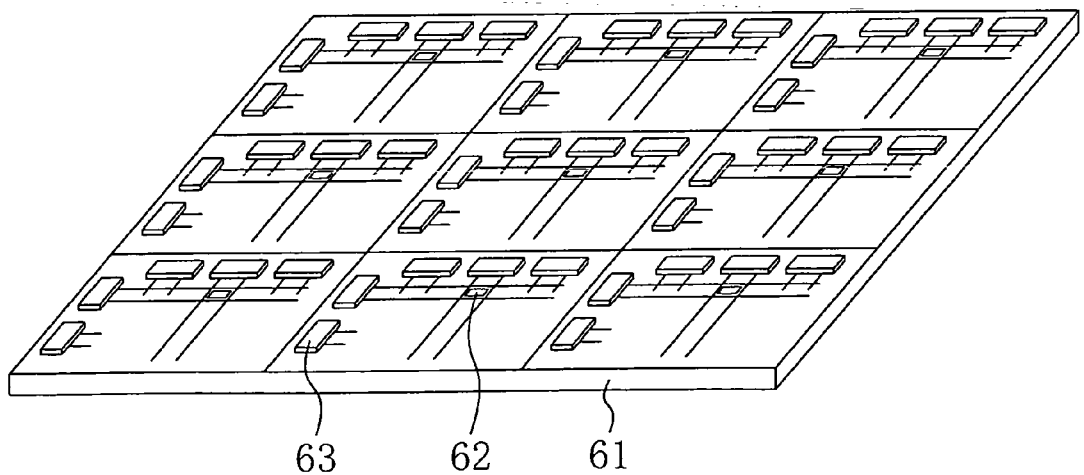
FIG. 34 is an oblique view schematically illustrating a glass substrate on which a plurality of elements have been formed.
Figure 35:
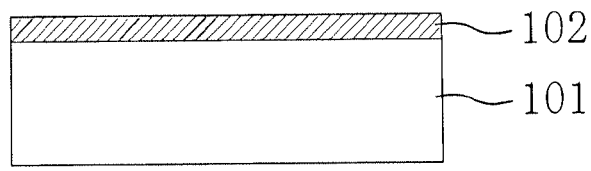
FIG. 35 is a view illustrating the conventional step of forming an insulating layer.
Figure 36:
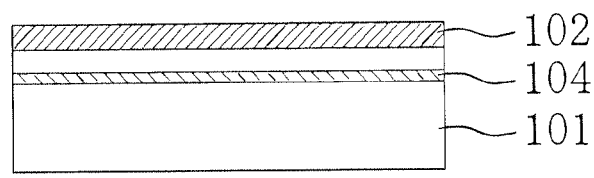
FIG. 36 is a view illustrating the conventional step of bonding a substrate to a glass substrate.
Figure 37:
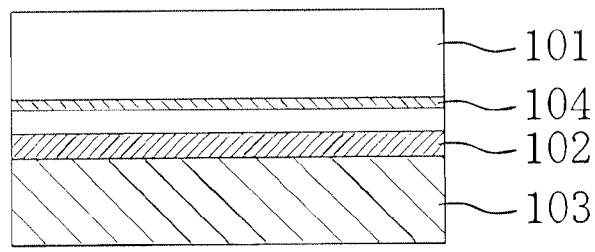
FIG. 37 is a view illustrating the conventional step of hydrogen implantation.
Figure 38:
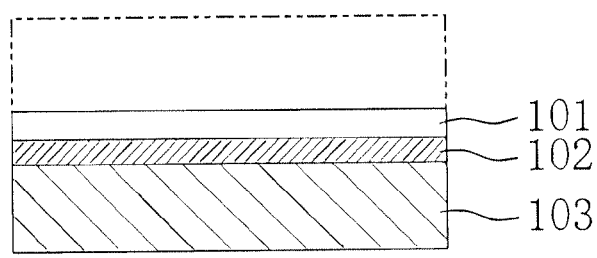
FIG. 38 is a view illustrating the conventional step of separating and removing part of a semiconductor layer.

Further, since the contact holes, electrodes and the like are formed after the bonding step. Therefore, if elements 62 such as passive elements or active elements are formed on a glass substrate 61 in advance as shown in FIG. 34, the elements 62 are electrically connected to semiconductor elements 63 each including the monocrystalline silicon layer at the same time when contacts and metal wires shared between the elements 62 and the semiconductor elements 63 are formed. This is advantageous to cost.

Further, by bonding the glass substrate and the monocrystalline silicon layer in proper alignment, elements on the glass substrate and those on the monocrystalline silicon layer are connected in the micron order, thereby allowing an improvement in packaging density. Moreover, since there is no need of considering the effects on the wiring material by the heat treatment at about 600° C. carried out in the separation step, a wide choice of the wiring material is offered. As a result, low melting point material such as Al can be used as electrode material. This allows a drastic decrease of electrical resistance of the electrode because of low resistance of Al, thereby improving the characteristics and reliability of the transistor.

Other Embodiments

In the foregoing embodiments, hydrogen ions are employed as the peeling substance. However, instead of hydrogen, hydrogen and at least one inert element (e.g., He, Ne, Ar, Xe and Rn) may be implanted. Since an inert gas such as helium is electrically inert, use of the inert gas and hydrogen in combination allows reduction in hydrogen concentration. As a result, the degree of adverse effects of hydrogen on the semiconductor elements T such as transistors is advantageously reduced. However, in this case, the ion implantation must be carried out twice. Therefore, for the sake of ease of manufacture, it is preferred to use hydrogen only as the peeling substance.

In the foregoing embodiments, a semiconductor silicon substrate is employed. However, the example embodiment presented herein is also applicable to other semiconductor substrates including compound semiconductors containing other elements.

In the foregoing embodiments, passive elements or active elements may be formed in advance on the glass substrate.

Further, in the foregoing embodiments, reference is made only to the MOS structure. However, the example embodiment is also applicable to the formation of various semiconductor elements such as bipolar transistors, thyristors, junction transistors, photonic devices and the like.

Thus, as described above, the example embodiment is useful as a method for manufacturing a semiconductor substrate and the semiconductor substrate itself. In particular, it is suitable for the method including the step of implanting ions of a certain element into a monocrystalline silicon substrate to form a peel layer and the step of peeling part of the substrate by heat treatment to thin down the substrate.

What is claimed is:

1. A method for manufacturing a semiconductor substrate comprising:
   (a) forming an anti-diffusion layer in the substrate that contains a diffusion inhibiting substance and the diffusion inhibiting substance is boron;
   (b) subsequently forming a peel layer in the substrate at a side of the anti-diffusion diffusion layer opposite a semiconductor device; and
   (c) performing heat treatment to peel part of the substrate off along the peel layer, wherein
   the anti-diffusion layer is formed to inhibit the diffusion of a peeling substance in the peel layer beyond the anti-diffusion layer, wherein
   the peel layer comprises hydrogen ions implanted into the substrate.

2. A method according to claim 1, wherein the substrate is a monocrystalline silicon substrate.

3. A method according to claim 1, wherein the substrate is provided with at least part of a semiconductor element before the part of the substrate is peeled off along the peel layer.

4. A method according to claim 3, wherein the anti-diffusion layer contains boron as a diffusion inhibiting substance for inhibiting the diffusion of the peeling substance and the concentration of the diffusion inhibiting substance in a semiconductor layer of the semiconductor element is $1 \times 10^{17}$ cm$^{-3}$ or less at the surface of the semiconductor layer.

5. A method according to claim 3 further comprising: forming a protective film on the substrate; forming a semiconductor layer as part of the semiconductor element in the substrate by ion implantation; removing the protective film; and forming an insulating film on the semiconductor substrate by heat treatment at a temperature of 900° C. or more, wherein the formation of an anti-diffusion layer is implemented by introducing a substance for forming the anti-diffusion layer by ion implantation.

6. A method according to claim 1, wherein the substrate is provided with a completed semiconductor element before the part of the substrate is peeled off along the peel layer.

7. A method according to claim 6, wherein the anti-diffusion layer contains boron as a diffusion inhibiting substance for inhibiting the diffusion of the peeling substance and the concentration of the diffusion inhibiting substance in a semiconductor layer of the semiconductor element is $1 \times 10^{17}$ cm$^{-3}$ or less at the surface of the semiconductor layer.

8. A method according to claim 1, wherein the peel layer and the anti-diffusion layer are removed from the substrate after the part of the substrate is peeled off.

9. A method according to claim 1, wherein the substrate is provided with at least part of a semiconductor element after the peel layer and the anti-diffusion layer are removed from the substrate.

10. A method according to claim 1, wherein the peel layer is a layer in which the peak of the concentration distribution of the peeling substance extends in a plane substantially parallel to the substrate surface.

11. A method according to claim 1, wherein the peeling substance is hydrogen.

12. A method according to claim 1, wherein the peeling substance is hydrogen and inert gas.

13. A method according to claim 1, wherein the anti-diffusion layer is formed by boron ion implantation performed at an implantation energy L (KeV) and a dose D (cm$^{-2}$) which satisfy the condition of $D \leq 2.7 \times 10^8 \times E^{2.78}$.

* * * * *